US011315812B2

(12) United States Patent
Fujikata et al.

(10) Patent No.: US 11,315,812 B2
(45) Date of Patent: Apr. 26, 2022

(54) SEMICONDUCTOR MANUFACTURING APPARATUS, FAILURE PREDICTION METHOD FOR SEMICONDUCTOR MANUFACTURING APPARATUS, AND FAILURE PREDICTION PROGRAM FOR SEMICONDUCTOR MANUFACTURING APPARATUS

(71) Applicant: EBARA CORPORATION, Tokyo (JP)

(72) Inventors: Jumpei Fujikata, Tokyo (JP); Yuji Araki, Tokyo (JP); Tensei Sato, Tokyo (JP); Ryuya Koizumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 690 days.

(21) Appl. No.: 15/945,487

(22) Filed: Apr. 4, 2018

(65) Prior Publication Data

US 2018/0294174 A1 Oct. 11, 2018

(30) Foreign Application Priority Data

Apr. 5, 2017 (JP) .............................. JP2017-075436

(51) Int. Cl.
*G05B 19/05* (2006.01)
*H01L 21/67* (2006.01)
(Continued)

(52) U.S. Cl.
CPC .......... *H01L 21/67276* (2013.01); *C25D 3/12* (2013.01); *G05B 19/058* (2013.01);
(Continued)

(58) Field of Classification Search
CPC ......... H01L 21/67276; H01L 21/67242; H01L 21/67288; H01L 21/67253; G05B 23/02;
(Continued)

(56) References Cited

U.S. PATENT DOCUMENTS

| 5,905,351 A | * | 5/1999 | Morishita | ............. G05B 19/19 |
| | | | | 318/560 |
| 5,908,463 A | * | 6/1999 | Akazaki | ................ F02D 41/008 |
| | | | | 123/480 |

(Continued)

FOREIGN PATENT DOCUMENTS

| JP | 2000-124094 A | 4/2000 |
| JP | 2002-363793 A | 12/2002 |

(Continued)

*Primary Examiner* — Douglas Kay
(74) *Attorney, Agent, or Firm* — BakerHostetler

(57) ABSTRACT

Provided is a semiconductor manufacturing apparatus, comprising: a first device; one or more sensors that detect physical quantities indicating a state of the first device; a first calculation circuit that calculates one or more feature quantities of the first device from the detected physical quantities; and a failure prediction circuit that monitors a temporal change in the one or more feature quantities calculated in the first calculation circuit, and stops receiving a new substrate when a duration for which a degree of deviation of the one or more feature quantities from those at a normal time is increasing exceeds a first time, and/or when a number of increases and decreases per unit time in the degree of deviation of the one or more feature quantities from those at the normal time exceeds a first number.

11 Claims, 17 Drawing Sheets

(51) Int. Cl.
*G05B 23/02* (2006.01)
*G05B 19/418* (2006.01)
*C25D 17/00* (2006.01)
*C25D 21/02* (2006.01)
*C25D 21/12* (2006.01)
*H01L 21/677* (2006.01)
*C25D 3/12* (2006.01)
*H01L 21/687* (2006.01)
*C25D 17/10* (2006.01)
*C25D 21/06* (2006.01)
*C25D 17/02* (2006.01)
*C25D 21/10* (2006.01)

(52) U.S. Cl.
CPC ....... *G05B 19/41875* (2013.01); *G05B 23/02* (2013.01); *G05B 23/0283* (2013.01); *H01L 21/67057* (2013.01); *H01L 21/67086* (2013.01); *H01L 21/67242* (2013.01); *H01L 21/67288* (2013.01); *H01L 21/67751* (2013.01); *H01L 21/68707* (2013.01); *C25D 17/001* (2013.01); *C25D 17/02* (2013.01); *C25D 17/10* (2013.01); *C25D 21/06* (2013.01); *C25D 21/10* (2013.01); *C25D 21/12* (2013.01); *G05B 2219/2602* (2013.01)

(58) Field of Classification Search
CPC ......... G05B 23/0283; G05B 19/41875; G05B 19/058; G05B 2219/2602; C25D 21/12; C25D 17/001
See application file for complete search history.

(56) References Cited

U.S. PATENT DOCUMENTS

| | | | |
|---|---|---|---|
| 7,133,807 | B2* | 11/2006 | Karasawa .......... G05B 23/0283 702/188 |
| RE45,687 | E | 9/2015 | Saito et al. |
| 9,502,273 | B2* | 11/2016 | Nishihara ............. B08B 7/0071 |
| 2003/0154052 | A1 | 8/2003 | Samata et al. |
| 2004/0073405 | A1* | 4/2004 | Karasawa .......... G05B 23/0283 702/188 |
| 2007/0179751 | A1* | 8/2007 | Karasawa .......... G05B 23/0283 702/188 |
| 2012/0301840 | A1* | 11/2012 | Poli ........................ A61C 1/003 433/27 |
| 2013/0315576 | A1* | 11/2013 | Nishihara ............. B08B 7/0071 392/416 |
| 2014/0195184 | A1* | 7/2014 | Maeda .................. G05B 21/02 702/85 |
| 2014/0245954 | A1 | 9/2014 | Minami et al. |
| 2016/0194780 | A1 | 7/2016 | Nagai et al. |
| 2016/0318077 | A1* | 11/2016 | Nishihara ......... H01L 21/67253 |
| 2017/0205816 | A1* | 7/2017 | Onoue ............... G05B 23/0208 |
| 2018/0275631 | A1* | 9/2018 | Kitamura ............. G06K 9/6215 |
| 2019/0171199 | A1* | 6/2019 | Unuma ............. G05B 23/0221 |

FOREIGN PATENT DOCUMENTS

| | | | |
|---|---|---|---|
| JP | 2003-077780 | A | 3/2003 |
| JP | 2003-331076 | A | 11/2003 |
| JP | 2005-241089 | A | 9/2005 |
| JP | 2008-097361 | A | 4/2008 |
| JP | 2008097361 | A * | 4/2008 |
| JP | 5184308 | B2 | 4/2013 |
| JP | 2014-169475 | A | 9/2014 |
| JP | 2016-127069 | A | 7/2016 |

* cited by examiner

SEMICONDUCTOR MANUFACTURING APPARATUS, FAILURE PREDICTION METHOD FOR SEMICONDUCTOR MANUFACTURING APPARATUS, AND FAILURE PREDICTION PROGRAM FOR SEMICONDUCTOR MANUFACTURING APPARATUS

TECHNICAL FIELD

The present invention relates to a semiconductor manufacturing apparatus, a failure prediction method for semiconductor manufacturing apparatus, and a failure prediction program for semiconductor manufacturing apparatus.

BACKGROUND ART

Wires, bumps (salient electrodes), and other components have hitherto been formed on the surfaces of substrates such as a semiconductor wafer and a printed circuit board. As a method for forming the wires, the bumps, and the other components, an electroplating method is known. A plating apparatus for performing electroplating includes a plurality of mechanisms to be driven by a motor. It is known that a motor load factor of such a motor increases due to aging degradation of the plating apparatus associated with its use, or other reasons. When the motor load factor exceeds an allowable value, an error occurs in the motor and the operation of the motor stops. This abruptly occurs during the normal operation of the apparatus, thereby disabling further operation of the apparatus and causing the substrate in the plating process to be scrapped.

Examples of the plating apparatus include a plating apparatus described in Japanese Patent No. 5184308. In this plating apparatus, a paddle 32 for agitating a plating solution is disposed adjacent to a substrate W so as to supply sufficient ions to the substrate W in a plating tank 10. The paddle 32 is reciprocated by the power of a motor 44. When the motor 44 stops due to a failure or some other reason, the drive of the paddle is stopped, to cause the substrate in the plating process to be scrapped. Examples of the mechanism driven by the motor in the plating apparatus other than the paddle include a traveling shaft and a lifting shaft of a transporter, and a rotation shaft for rocking a substrate holder in a substrate setting/removing unit.

Also in a sensor, degradation of the sensor's sensitivity due to its use for a long period, or displacement, may occur and abrupt erroneous detection may thus occur. When the sensor makes erroneous detection and an error occurs, the subsequent operation of the apparatus cannot be performed, causing the substrate in the plating process to be scrapped.

The motor and the sensor are also used in each of semiconductor manufacturing apparatuses other than the plating apparatus as thus described, such as a chemical vapor deposition 'CVD' apparatus, a polishing or grinding apparatus, a dicing apparatus, and a sealing apparatus. When an abrupt failure or error occurs in the motor or the sensor provided in the semiconductor manufacturing apparatus as above, the apparatus becomes inoperable, which may cause the substrate in the process to be scrapped or may, in some instances, cause deterioration in operation rate of the apparatus.

CITATION LIST

Patent Literatures

PTL 1: Japanese Patent No. 5184308
PTL 2: Japanese Patent Laid-Open No. 2016-127069
PTL 3: Japanese Patent Laid-Open No. 2014-169475

SUMMARY OF INVENTION

Technical Problem

An object of the present invention is to solve at least part of the problems described above.

Solution to Problem

According to an aspect, a semiconductor manufacturing apparatus is provided. This semiconductor manufacturing apparatus includes: a first device; one or more sensors that detect physical quantities indicating a state of the first device; a first calculation circuit that calculates one or more feature quantities of the first device from the detected physical quantities; and a failure prediction circuit that compares the one or more feature quantities calculated in the first calculation circuit with a plurality of pieces of model data of a temporal change in one or more feature quantities until the first device fails, decides a piece of model data with the minimum difference from the calculated one or more feature quantities among the plurality of pieces of model data, calculates predicted failure time from a difference between a failure point in time and a point in time at which a difference from the calculated one or more feature quantities is the minimum in the piece of model data, and stops receiving a new substrate when the predicted failure time is smaller than a predetermined threshold. The first calculation circuit and the failure prediction circuit can be made up of a program for performing the above process and a computer for running that program. Alternatively, the first calculation circuit and the failure prediction circuit may be made up of hardware dedicated to an application specific integrated circuit such as an ASIC or a programmable logic circuit 'PLC'. The functions of the first calculation circuit and the failure prediction circuit may be divided and achieved in a plurality of devices (a plurality of computers, a plurality of pieces of application specific hardware, or a combination of one or more computers or one or more pieces of application specific hardware).

According to an aspect, a semiconductor manufacturing apparatus is provided. This semiconductor manufacturing apparatus includes: a first device; one or more sensors that detect physical quantities indicating a state of the first device; a first calculation circuit that calculates one or more feature quantities of the first device from the detected physical quantities; and a failure prediction circuit that monitors a temporal change in the one or more feature quantities calculated in the first calculation circuit, and stops receiving a new substrate when a duration for which a degree of deviation of the one or more feature quantities from those (one or more feature quantities) at the normal time exceeds a first time, and/or when a number of increases and decreases per unit time in the degree of deviation of the one or more feature quantities from those at the normal time exceeds a first number.

DESCRIPTION OF EMBODIMENTS (Plating Apparatus)

Figure 1:
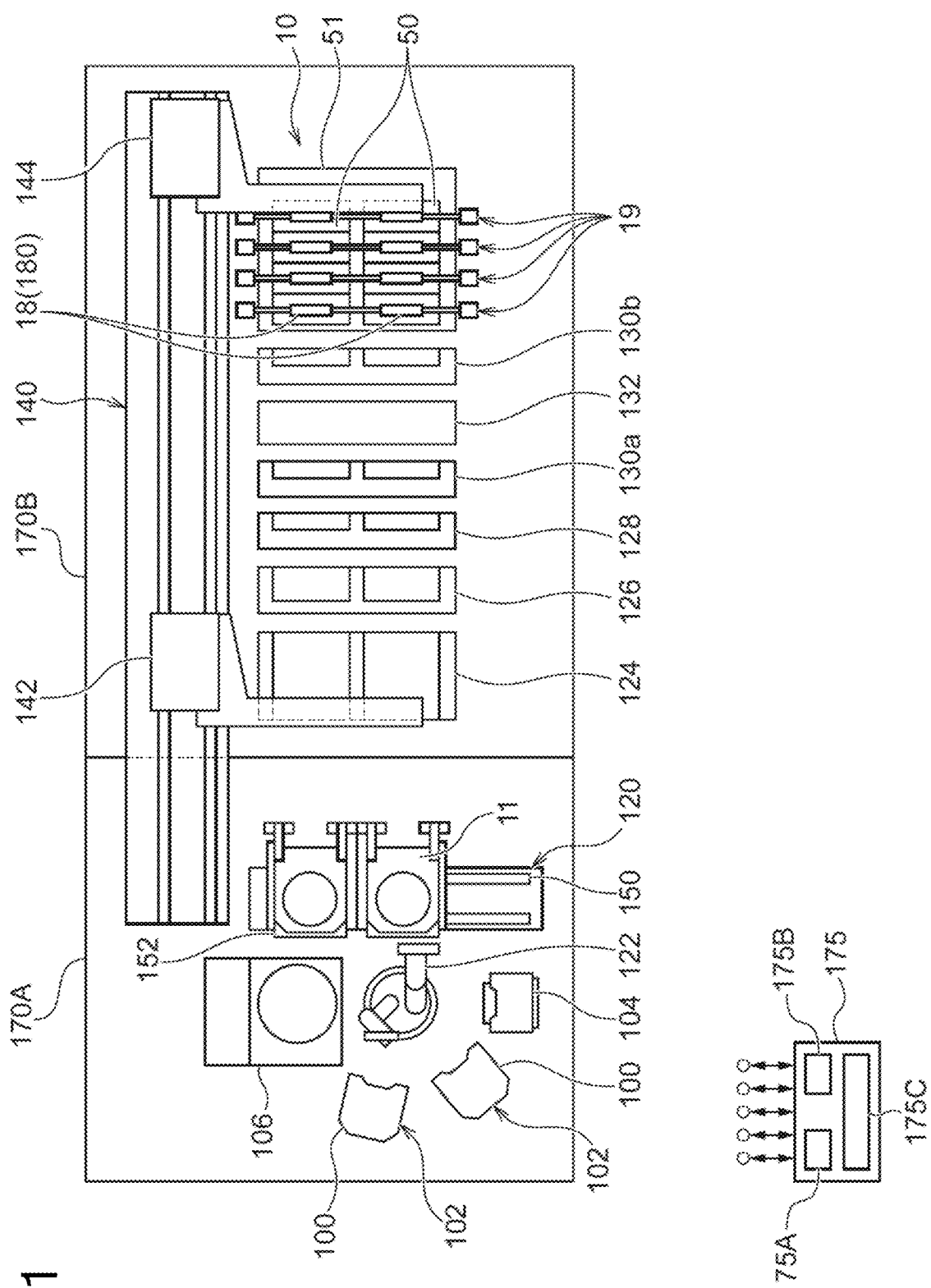
FIG. 1 is a general layout diagram of a plating apparatus according to one embodiment of the present invention.

FIG. 1 is a general layout diagram of a plating apparatus according to one embodiment of the present invention. As shown in FIG. 1, this plating apparatus 1 includes: a loading/unloading unit 170A that loads a substrate W (cf. FIG. 2), which is a plated body such as a semiconductor wafer, into a substrate holder 11 or unloads the substrate W from the substrate holder 11; and a plating treatment unit 170B that treats the substrate W.

The loading/unloading unit 170A includes two cassette tables 102, an aligner 104 that aligns positions of an orientation flat, a notch, or the like of the substrate W with a predetermined direction, and a spin rinse drier 106 that dries the substrate W after plating treatment by rotating the substrate W at a high speed. A cassette 100 housing the substrate W such as the semiconductor wafer is mounted on the cassette table 102. A substrate setting/removing unit (fixing station) 120, in which the substrate holder 11 is placed to set or remove the substrate W, is provided close to the spin rinse drier 106. At the center of these units: the cassette tables 102, the aligner 104, the spin rinse drier 106, and the substrate setting/removing unit 120, there is disposed a substrate carrier device 122 including a carrier robot for carrying the substrate W among these units.

The substrate setting/removing unit 120 includes a flat placement plate 152 laterally slidable along a rail 150. Two substrate holders 11 are placed in parallel with each other in a horizontal state to the placement plate 152. The substrate W is passed or received between one substrate holder 11 and the substrate carrier device 122, and thereafter the substrate W is passed or received between the other substrate holder 11 and the substrate carrier device 122. Note that in the present application, the term "substrate" includes not only a semiconductor substrate, a glass substrate, a printed circuit board (printed board), but also a magnetic recording medium, a magnetic recording sensor, a mirror, an optical element, a micromachine element, and a partially produced integrated circuit. The shape of the substrate is not limited to a round shape, but may be a square shape, for example.

The treatment unit 170B of the plating device 1 includes a stocker 124, a pre-wetting tank 126, a pre-soaking tank 128, a first cleaning tank 130a, a blow tank 132, a second cleaning tank 130b, and a plating tank 10. In the stocker (also referred to as a stocker container setting unit) 124, the substrate holder 11 is stored and temporarily stored. In the pre-wetting tank 126, the substrate W is immersed into pure water. In the pre-soaking tank 128, an oxide film on the surface of a conductive layer such as a seed layer, which is formed on the surface of the substrate W, is etched and removed. In the first cleaning tank 130a, the pre-soaked substrate W is cleaned by a cleaning solution (pure water, etc.) along with the substrate holder 11. In the blow tank 132, the cleaned substrate W is drained. In the second cleaning tank 130b, the plated substrate W is cleaned by the cleaning solution along with the substrate holder 11. The stocker 124, the pre-wetting tank 126, the pre-soaking tank 128, the first cleaning tank 130a, the blow tank 132, the second cleaning tank 130b, and the plating tank 10 are disposed in this order. Note that the configuration of the treatment unit 170B of the plating apparatus 1 is one example and not limited to this, but another configuration can be adopted.

The plating tank 10 has a plurality of plating cells (units) 50 including an overflow tank 51, for example. Each plating cell 50 houses one substrate W inside and immerses the substrate W into a plating solution held inside to perform plating treatment on the surface of the substrate W with copper, gold, silver, solder, nickel, or the like.

The type of the plating solution here is not particularly limited, but a variety of plating solutions are used in accordance with the application. For example, in the case of a copper plating process, typically, the plating solution is made to contain chemical species called an inhibitor (surfactant, etc.) that acts so as to be adsorbed to the copper surface with chlorine as a medium, a promoter (organic sulfur compound, etc.) that acts so as to promote plating of a recess, and a smoothing agent (quaternary amine, etc.) that inhibits a deposition promoting effect of the promoter to improve the flatness of the film thickness.

As the plating solution, there is used a plating solution containing cobalt-tungsten-boron (CoWB), cobalt-tungsten-phosphorus (CoWP), or the like, for forming a metal film on the surface of the substrate W having Cu wires. In order to prevent diffusion of Cu in an insulating film, there may be used a plating solution for forming a barrier film to be provided on the surface of the substrate W and the surface of the recess of the substrate W before formation of the Cu wires, such as a plating solution containing CoWB or tantalum (Ta).

The plating apparatus 1 includes a substrate holder carrier device 140 that is located lateral to the each of the above equipment (the stocker 124, the pre-wetting tank 126, the pre-soaking tank 128, the first cleaning tank 130*a*, the blow tank 132, the second cleaning tank 130*b*, the plating tank 10, and the substrate setting/removing unit 120), carries the substrate holder 11 with the substrate W among the equipment. The substrate holder carrier device 140 employs a linear motor system, for example. This substrate holder carrier device 140 includes a first transporter 142 and a second transporter 144. The first transporter 142 is configured so as to carry the substrate W among the substrate setting/removing unit 120, the stocker 124, the pre-wetting tank 126, the pre-soaking tank 128, the first cleaning tank 130*a*, and the blow tank 132. The second transporter 144 is configured so as to carry the substrate W among the first cleaning tank 130*a*, the second cleaning tank 130*b*, the blow tank 132, and the plating tank 10. In another embodiment, the first transporter 142 and the second transporter 144 may transport the substrate W among units in another combination. In another embodiment, the plating apparatus 1 may include any one of the first transporter 142 and the second transporter 144.

In each plating cell 50, a paddle device 180 for agitating the plating solution in the plating cell 50 is disposed. The paddle device 180 includes a paddle 18 as a stirring stick to agitate the plating solution, and a paddle driving device 19 that is disposed on each side of the overflow tank 51 and drives the paddle 18.

A plating treatment system including a plurality of plating treatment apparatuses configured as above includes a controller 175 configured so as to control each unit described above. The controller 175 includes a memory 175B that stores a predetermined program, a central processing unit (CPU) 175A that runs the program in the memory 175B, and a control unit 175C that is achieved by the CPU 175A running the program. Part of the control unit 175C may be made up of hardware dedicated to an application specific integrated circuit such as an ASIC or a PLC. The control unit 175C can, for example, control the carriage of the substrate carrier device 122, control the carriage of the substrate holder carrier device 140, control a plating current and the time for plating in the plating tank 10, control an opening diameter of a regulation plate 34 disposed in each plating cell 50 and an opening diameter of an anode mask (not shown), and perform a failure prediction process on each unit. The controller 175 is configured to be communicable to a host controller, not shown, for performing integrated control on the plating apparatus 1 and other related apparatuses, and the controller 175 can exchange data with a data base in the host controller. A storage medium constituting the memory 175B here stores a variety of pieces of setting data, and a variety of programs such as a plating treatment program described later. As the storage medium, there can be used a known medium being a computer readable memory such as a ROM or a RAM, a hard disk, or a disk-shaped storage medium such as a CD-ROM, a DVD-ROM, or a flexible disk.

(Plating Cell)

Figure 2:
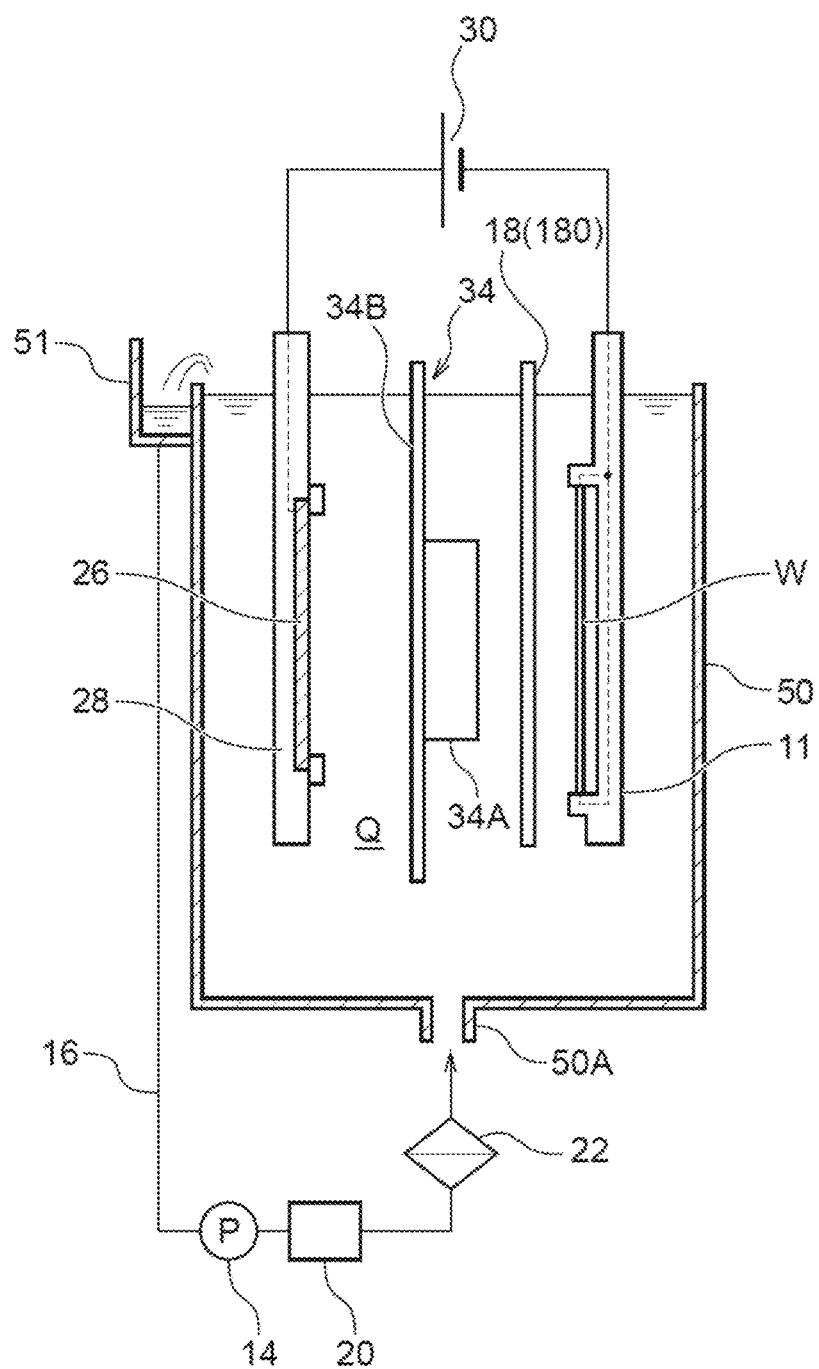
FIG. 2 is a longitudinal side view showing a plating cell that includes a paddle device.
Figure 3:
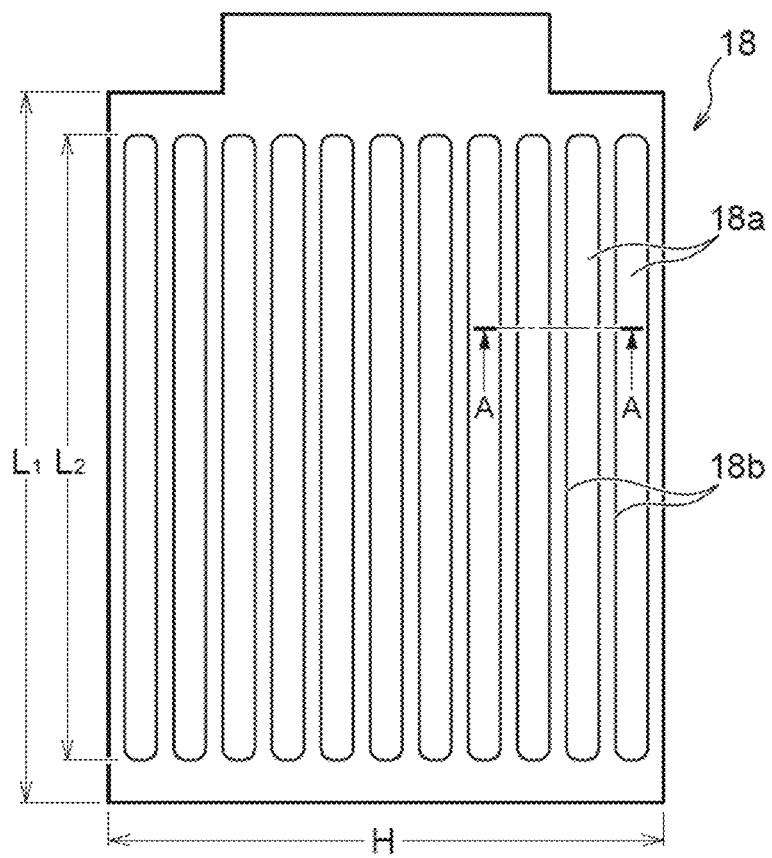
FIG. 3 is a plan view showing a paddle of the plating cell shown in FIG. 2.
Figure 4:
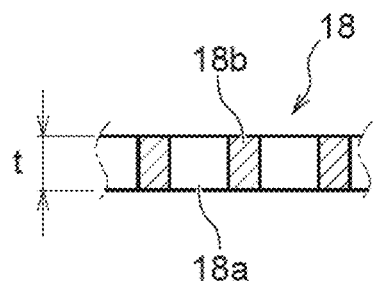
FIG. 4 is a sectional view taken along a line A-A of FIG. 3.

FIG. 2 is a longitudinal side view showing the plating cell that includes the paddle device. FIG. 3 is a plan view showing a paddle of the plating cell shown in FIG. 2. FIG. 4 is a sectional view taken along a line A-A of FIG. 3. As shown in FIG. 2, the plating cell 50 has a plating solution Q inside and includes on an upper outer circumference the overflow tank 51 that catches the plating solution Q having overflowed from the edge of the plating cell 50. One end of a plating solution supply channel 16 including a pump 14 is connected to the bottom of the overflow tank 51, and the other end of the plating solution supply channel 16 is connected to a plating solution supply port 50A provided on the bottom of the plating cell 50. Accordingly, the plating solution Q collected in the overflow tank 51 is returned into the plating cell 50 with the drive of the pump 14. A constant temperature unit 20 for adjusting the temperature of the plating solution Q and a filter 22 for filtering and removing a foreign matter in the plating solution are disposed on the plating solution supply channel 16 at downstream of the pump 14.

The plating apparatus includes the substrate holder 11 that removably holds the substrate (plated body) W and immerses the substrate W in a vertical state into the plating solution Q in the plating cell 50. In the plating cell 50, an anode 26 is held in an anode holder 28 and immersed and disposed in the plating solution Q in a position facing the substrate W held in the substrate holder 11 and immersed in the plating solution Q. In this example, as the anode 26, phosphorus-containing copper is used. The substrate W and the anode 26 are electrically connected via a plating power source 30, and a plating film (copper film) is formed on the surface of the substrate W by allowing a current to flow between the substrate W and the anode 26.

The paddle 18 is disposed between the anode 26 and the substrate W which is held in the substrate holder 11 and immersed and disposed in the plating solution Q, the paddle 18 reciprocating parallel to the surface of the substrate W to agitate the plating solution Q. The paddle driving device 19 (FIG. 5) drives the paddle 18. Agitating the plating solution with the paddle 18 in this manner enables uniform supply of sufficient copper ions to the surface of the substrate W. Further, the regulation plate 34, made up of a dielectric for making a potential distribution throughout the surface of the substrate W more uniform, is disposed between the paddle 18 and the anode 26. The regulation plate 34 is made up of a cylindrical portion 34A and a flange portion 34B having a rectangular contour and disposed around the cylindrical portion 34A, and vinyl chloride being a dielectric is used as a material for the regulation plate 34. The regulation plate 34 is placed in the plating cell 50 such that the tip of the cylindrical portion 34A is located on the substrate side and the flange portion 34B is located on the anode side. The cylindrical portion 34A has such an opening as to be able to sufficiently control expansion of an electric field and has a length along a shaft center. The flange portion 34B is provided so as to shield an electric field formed between the anode 26 and the substrate W.

As shown in FIGS. 3 and 4, the paddle 18 is made up of rectangular plate members having a uniform plate thickness t, and a plurality of long holes 18*a* are provided parallelly inside the paddle 18, so that a plurality of perpendicularly extending lattice portions 18*b* are provided in the paddle 18. A material for the paddle 18 is obtained by, for example, coating titanium with Teflon (registered trademark). A vertical length L1 of the paddle 18 and a longitudinal dimension L2 of the long hole 18*a* are set so as to be sufficiently larger than a vertical direction of the substrate W. A lateral length H of the paddle 18 is set such that a length obtained by adding an amplitude (stroke St) of the reciprocation of the paddle 18 to the lateral length H is sufficiently larger than a lateral dimension of the substrate W.

The widths and the number of long lengths 18*a* are preferably determined such that the lattice portion 18*b* between the long holes 18*a* is as thin as possible in a range in which the lattice portion 18*b* has required rigidity, so that the lattice portion 18*b* efficiently agitates the plating solution and allows the plating solution to efficiently pass through the long hole 18*a*. It is advantageous to make the lattice portion 18b of the paddle 18 thin in order also to reduce an influence of formation of a shade of the electric field (a place not influenced by the electric field or a place having a small shade of the electric field) on the substrate W at the time when the moving speed of the paddle 18 decreases, or momentously stops, in the vicinity of each end of the reciprocation of the paddle 18.

In this example, as shown in FIG. 4, the long hole 18a is vertically formed such that a lateral cross section of each lattice portion 18b has a rectangular shape. Note that the shape of the lateral cross section of each lattice portion 18b is not limited to a rectangular shape, but may be an optically selected shape. The four corners of the lateral cross section of the lattice portion 18b may be chamfered, or an angle may be formed with respect to the lattice portions 18b such that the lateral cross section of the lattice portion 18b has a parallelogram shape.

Figure 5:
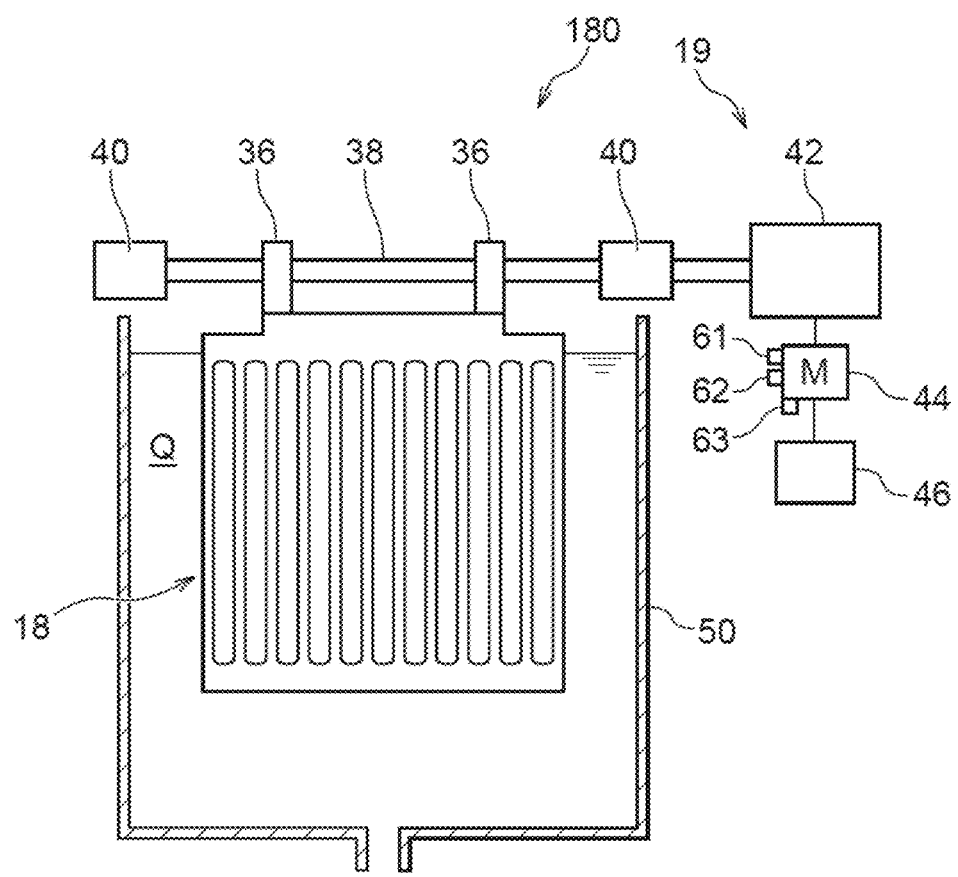
FIG. 5 is a longitudinal front view showing a paddle driving device along with the plating cell.

FIG. 5 is a longitudinal front view showing the paddle driving device along with the plating cell. The paddle 18 is fixed to a horizontally extending shaft 38 with cramps 36 clamped to the upper end of the paddle 18. The shaft 38 is configured so as to be slidable from side to side while held in shaft holding units 40. The end of the shaft 38 is coupled to the paddle driving device 19 that linearly reciprocates the paddle 18 from side to side. The paddle driving device 19 includes the motor 44 and a drive unit 42 that converts the rotation of the motor 44 to the linear reciprocation of the shaft 38 by a crank mechanism, not shown. In this example, there is provided a control unit 46 that controls the rotating speed of the motor 44 in the paddle driving device 19 so as to control the moving speed of the paddle 18. Note that the mechanism of the drive unit 42 may not only be the crank mechanism, but also another rotary-to-linear conversion mechanism. For example, there may be used a mechanism configured to convert the rotation of a servo motor to the linear reciprocation by using a ball screw. Alternatively, there may be used a mechanism that linearly reciprocates the shaft with a linear motor in place of the motor 44 and the drive unit 42. The control unit 46 may be a control device different from the controller 175, or may be achieved as part of the function of the controller 175. A failure prediction program is run in the control unit 46 or the controller 175.

(Failure Prediction Process)

Next, a failure prediction process for the motor 44 of the paddle driving device 19 will be described. The failure prediction process can be performed by the controller 175, the control unit 46, or other computers provided on the inside or outside of the plating apparatus. Note that the failure prediction process may be divided and performed by a plurality of controllers, control units, and/or computers in combination. Alternatively, the failure prediction process may be performed using hardware dedicated to an application specific integrated circuit such as an ASIC or a PLC, or part of the process may be performed using dedicated hardware.

Figure 6:
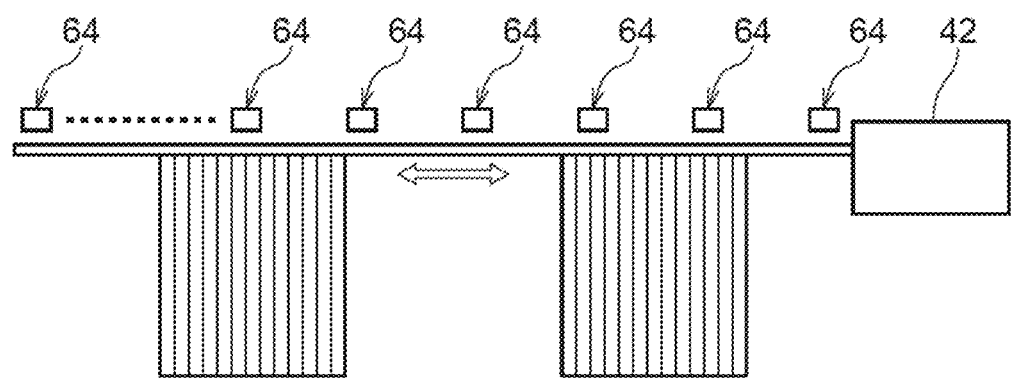
FIG. 6 is an explanatory view for explaining acquisition of shift in a plurality of spots on a shaft of the paddle.
Figure 7:
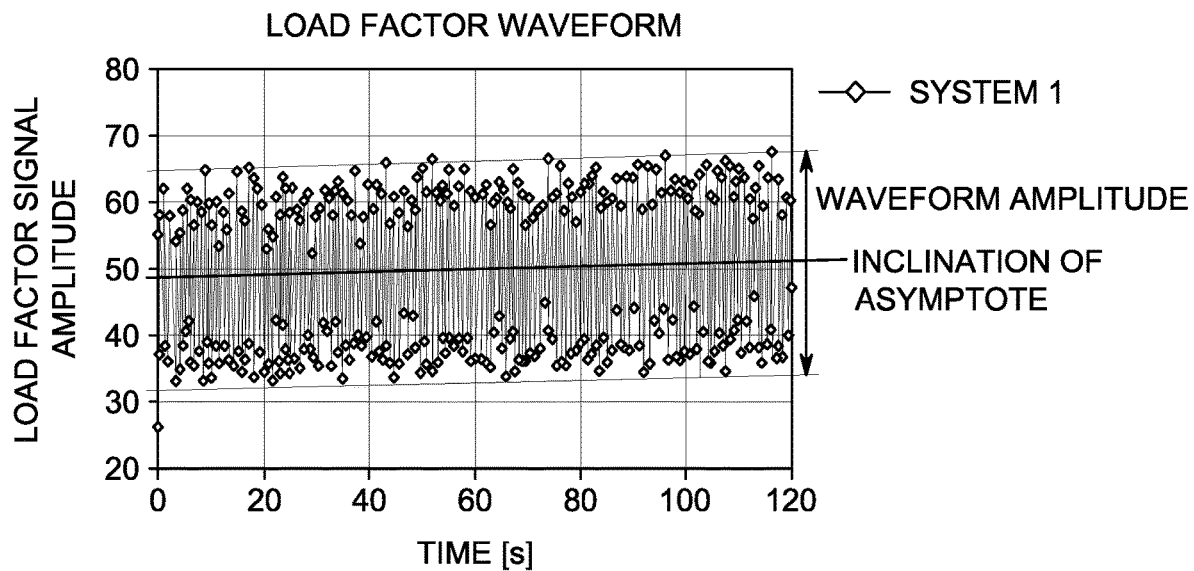
FIG. 7 is a measurement example of a motor load factor.
Figure 8:
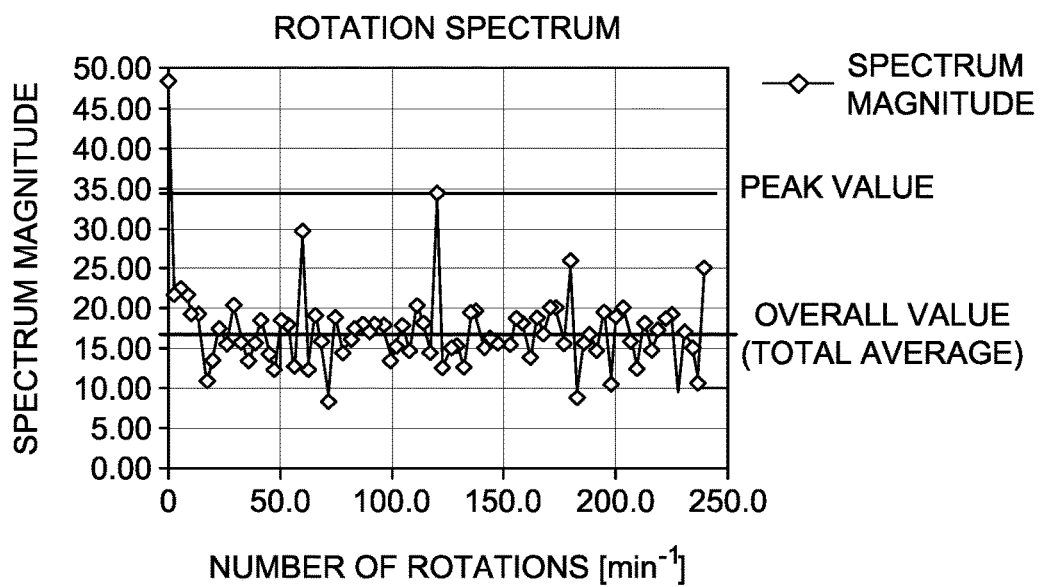
FIG. 8 is a spectrum of the measurement example of the motor load factor.
Figure 9:
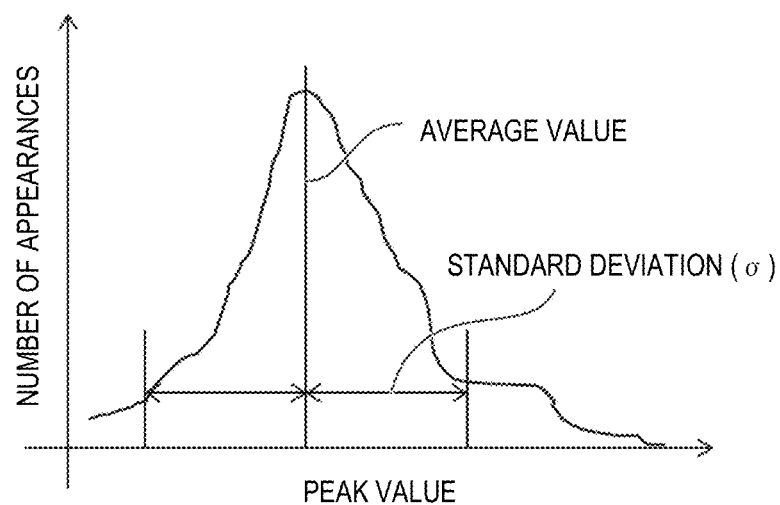
FIG. 9 is a schematic diagram for explaining an average value and a standard deviation of peak values.

FIG. 6 is an explanatory view for explaining acquisition of shifts in a plurality of spots on the shaft of the paddle. FIG. 7 is a measurement example of a motor load factor. FIG. 8 is a spectrum of a measurement example of the motor load factor. FIG. 9 is a schematic diagram for explaining an average value and a standard deviation of peak values.

(Detection of Physical Quantity)

The failure prediction of the paddle device is performed by continuously acquiring a variety of (one or more) physical quantities concerning the paddle device 180. The physical quantities include at least a load factor of the motor 44, vibration of the motor 44, sound of the motor 44, a temperature of the motor 44, and a shift of the shaft 38. The load factor of the motor is acquired using an output value from a motor driver (not shown) included in the motor 44. The vibration of the motor is acquired by an acceleration sensor 61 fitted to a casing of the motor 44. The sound of the motor is acquired by a microphone 62 provided in the casing of the motor 44 or in the vicinity of the motor 44. Note that an output of the microphone 62 is preferably converted to a digital signal with an A/D convertor, not shown. The A/D convertor is built in the microphone 62 or provided outside the microphone 62 (e.g., in the control unit 46). The temperature of the motor is acquired by a temperature sensor 63 provided in the casing of the motor 44 or in the vicinity of the motor 44. As shown in FIG. 6, the shift of the shaft 38 is acquired by a plurality of shift sensors 64 placed at a plurality of spots longitudinally on the shaft 38. As the shift sensor 64, for example, an optical sensor can be adopted to optically detect a distance to a predetermined spot of the shaft 38. Each shift sensor 64 detects a vertical shift of the shaft 38 in its placed position. That is, each shift sensor detects the shift of the shaft 38 in a direction orthogonal to the longitudinal direction of the shaft 38. These physical quantities are continuously acquired during the operation of the paddle device 180 at all times.

(Calculation of Feature Quantities)

Next, the following feature quantities are calculated from physical quantities concerning the paddle device 180. The feature quantity shows the state of the device, and is the physical quantity concerning the device itself or a value calculated from the physical quantity. As the load factor of the motor, at least one of a waveform amplitude, an inclination of an asymptote, a peak value and an overall value (a total average value, an average of all values) of a frequency spectrum, an average value of a waveform peak distribution, and a standard deviation of the waveform peak distribution is calculated as a feature quantity from a measured load factor waveform as shown in FIG. 7, for example. The waveform amplitude is calculated as a difference between the top and the bottom of peak values of the load factor waveform, for example (FIG. 7). The inclination of the asymptote is taken as an inclination of an asymptote obtained by calculating a measured value of the load factor by the least-square method or some other method, for example (FIG. 7). The peak value of the frequency spectrum is calculated as a peak value in a spectrum obtained by transforming the load factor waveform to a frequency by fast Fourier transformation or some other method (FIG. 8). The overall value (total average value) is calculated as a value obtained by averaging the whole of the frequency spectral value (FIG. 8). The average value of the waveform peak distribution is calculated as an average value of peak values of the load factor waveform (FIG. 9). The standard deviation of the waveform peak distribution is calculated as a standard deviation of the peak values of the load factor waveform (FIG. 9). In addition to, or in place of, the average value and the standard deviation of the peak values of the load factor waveform, an average value and a standard deviation of peak values of the frequency spectrum may be obtained.

Also as for the vibration of the motor, similarly to the case of the load factor of the motor described above, at least one of a waveform amplitude, an inclination of an asymptote, a peak value of a frequency spectrum, an overall value (a total average value) of the frequency spectrum, an average value of a waveform peak distribution, and a standard deviation of the waveform peak distribution is calculated as a feature quantity from a measured vibration waveform. In this case, each of the vibration waveform, the frequency spectrum of the vibration waveform, and the peak value of the vibration waveform (and/or the peak value of the frequency spectrum) can be obtained in the same manner as in FIGS. 7, 8, and 9.

Also as for the sound of the motor, similarly to the case of the load factor of the motor described above, at least one of a waveform amplitude, an inclination of an asymptote, a peak value of a frequency spectrum, and an overall value (a total average value) of the frequency spectrum, an average value of a waveform peak distribution, and a standard deviation of the waveform peak distribution is calculated as a feature quantity from a measured sound waveform. In this case, each of the sound waveform, the frequency spectrum of the sound waveform, and the peak value of the sound waveform (and/or the peak value of the frequency spectrum) can be obtained in the same manner as in FIGS. 7, 8, and 9.

As for the temperature of the motor, at least one of a measured temperature itself and an inclination of a temporal change in temperature value is calculated as a feature quantity.

As for the shift of the shaft 38, at least one of a shift amplitude, a shift rate, a shift acceleration, and a difference in shift from an adjacent position (an inclination of the shaft) is calculated as a feature quantity. By use of these feature quantities, vibration and distortion of the swinging shaft 38 can be detected to find a sign of failure.

The feature quantities described above are taken as vectors and defined as: X={x1, x2, x3, . . . }. For example, concerning the motor load factor, the waveform amplitude is defined as x1, the inclination of the asymptote as x2, the peak value of the frequency spectrum as x3, the overall value (total average value) as x4, the average value of the waveform peak distribution as x5, and the standard deviation of the waveform peak distribution as x6.

(Learning by Support Vector Machine)

Further, machine learning is performed by a support vector machine by using the above feature quantity. Note that the support vector machine is configured as a program to be run in the controller 175, the control unit 46 and/or another computer (inside and/or outside the plating apparatus), for example.

The machine learning in the support vector machine is performed as follows:
(1) a plurality of feature quantity samples at the normal time and a plurality of feature quantity samples at the time of failure are prepared and defined as a normal data set and a failure data set, respectively.
(2) An identifier is generated by learning with the support vector machine, using the defined normal data set and failure data set as training samples. The identifier is generated as a program to be run in the computer.

(Normality/Abnormality Determination)

During the operation of the paddle device 180, the identifier generated by the support vector machine determines or evaluates a newly measured feature quantity. When the feature quantity (the operation state of the paddle device) is determined as abnormal as a result of the determination, a Fault alarm or a Warning alarm is generated.

In the present specification, the term "failure" is defined as a state in which a part or all of constituent equipment (device) is broken and its function is damaged. The term "abnormality" is defined as a state in which the function has deteriorated as compared with that at the normal time or the function is damaged. That is, the state of "abnormality" includes the state of "failure". In the present embodiment, a concept that abnormality is Middle Fault, being a situation prior to a failure, is further used. In place of the identifier generated by the support vector machine, the Mahalanobis distance from the normal data set may be used to determine the normality or abnormality.

(Calculation of Predicted Failure Time)

Figure 10:
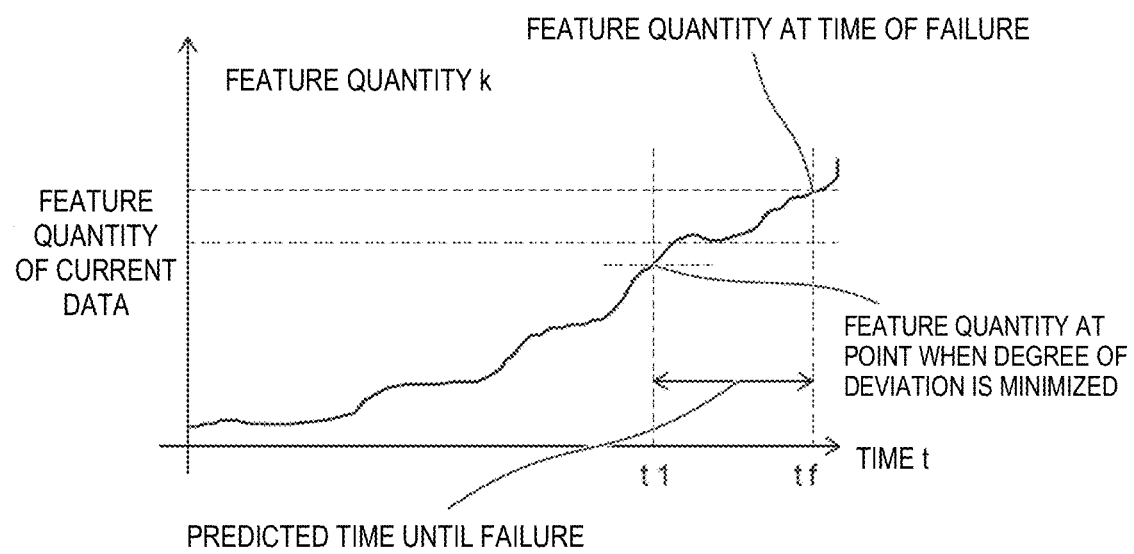
FIG. 10 is one example of data of a temporal change in feature quantity in a certain failure event.

The feature quantity samples at the time of failure described above in the learning performed by the support vector machine and a waveform data package at that time are previously registered into the database. That is, a temporal change in feature quantities from the normal state to the failure state is registered as failure models (failure model data) with respect to each failure event (or failure type). Examples of the abnormal portion (failure type) and the failure include deformation/damage of the shaft 38, damage of a shaft bearing (shaft holder 40) of the shaft 38, a failure of the motor 44, and a failure of a coupling unit. Examples of the failure of the coupling unit include a failure of the cramp 36 being a coupling unit for the puddle 18 and the shaft 38, a failure of a coupling unit for the shaft 38 and the drive unit 42, and a failure of a coupling unit for the motor 44 and the drive unit 42. This database can be stored into a memory provided in the controller 175, the control unit 46, or another computer, or another memory. A change in feature quantity concerning the failure data is analyzed using a time series, and that data is registered as well. FIG. 10 is one example of data of a temporal change in feature quantity in a certain failure event.

When the feature quantity is determined as abnormal in the normality/abnormality determination described above, a difference (a degree of deviation) between a feature quantity vector at each point in time of all pieces of the failure model data registered in the database and a feature quantity vector of the current data of a determination target is calculated based on [Math. 1]. The degree of deviation can be the Mahalanobis distance, for example.

Deviation Degree $$D = \sum_k \left( \frac{x_k - x_{mk}[t]}{x_{mk}[t]} \right)^2 \qquad \text{[Math. 1]}$$

where xk is a feature quantity of the current data of the determination target, and k indicates the type of the feature quantity. xk is also referred to as a feature quantity k. Further, xmk[t] shows the feature quantity k of a failure model m at a time t. In this example, k and m are assumed to be natural numbers.

Failure model data with the smallest degree of deviation from the feature quantity of the current data of the determination target is determined as the most possible abnormality generation portion (failure model). Note that a plurality of pieces of model data with relatively small degrees of deviation may be extracted and it may be determined that there are a plurality of possible abnormality generation portions. Further, in the determined failure model, predicted time until the failure (predicted failure time) is calculated from a difference (tf−t1) between a failure generated time tf and a time t1, at which the degree of deviation from the current data of the determination target is the smallest, by using the temporal change data of FIG. 10, for example.

When there are a plurality of points with the same degree of deviation in FIG. 10, a point with the minimum predicted time until the failure is selected. When the determined failure model data includes a plurality of feature quantities, the minimum predicted time is selected among predicted time until the failure based on each feature quantity. When a plurality of pieces of failure model data are extracted, the minimum predicted time until the failure is selected.

When the predicted time is shorter than the lower limit time, the Middle Fault alarm is generated so as not to receive a new substrate. When the predicted time until the failure is not shorter than the lower limit time, the Warning alarm is generated and the production is continued. The lower limit time can, for example, be the time obtained by providing a predetermined margin to the plating treatment time for one substrate, or the time obtained by providing a predetermined margin to the time when the plating treatment on all the substrates carried into the plating apparatus can be completed.

When a plurality of pieces of failure model data with relatively small degrees of deviation are extracted and it is determined that there are a plurality of possible abnormality generation portions, a piece of failure model data with the minimum predicted time until the failure may be selected among the pieces of failure model data, and the selected piece of model data may be used in determination based on the lower limit time.

The predicted time until the failure here is determined on the premise that comparable accumulated numbers of operation of the device are performed within the same time among the plurality of failure model data, and it is not necessarily reasonable to make determination based on the time when the accumulated numbers of operation are greatly different. Thus, the predicted accumulated number of operations until the failure may be taken as the determination target in place of the predicted time until the failure. In this case, a horizontal axis of the failure model data (FIG. 10) is taken as the accumulated number of operations in place of elapsed time. Which is to be adopted between the predicted time or the predicted accumulated number of operations is determined in consideration of the operating situation until the failure as described above. There is an advantage of being able to reflect the operating situation to the device in the case of using the accumulated number of operations, while there is an advantage of facilitating comparison with the time required for preparing spare items and preparing replacement in the case of using the predicted time. A reasonable determination reference may be selected in consideration of the operating situation, the time required for preparing spare items and preparing replacement, and other situations.

(Flowchart)

Figure 11:
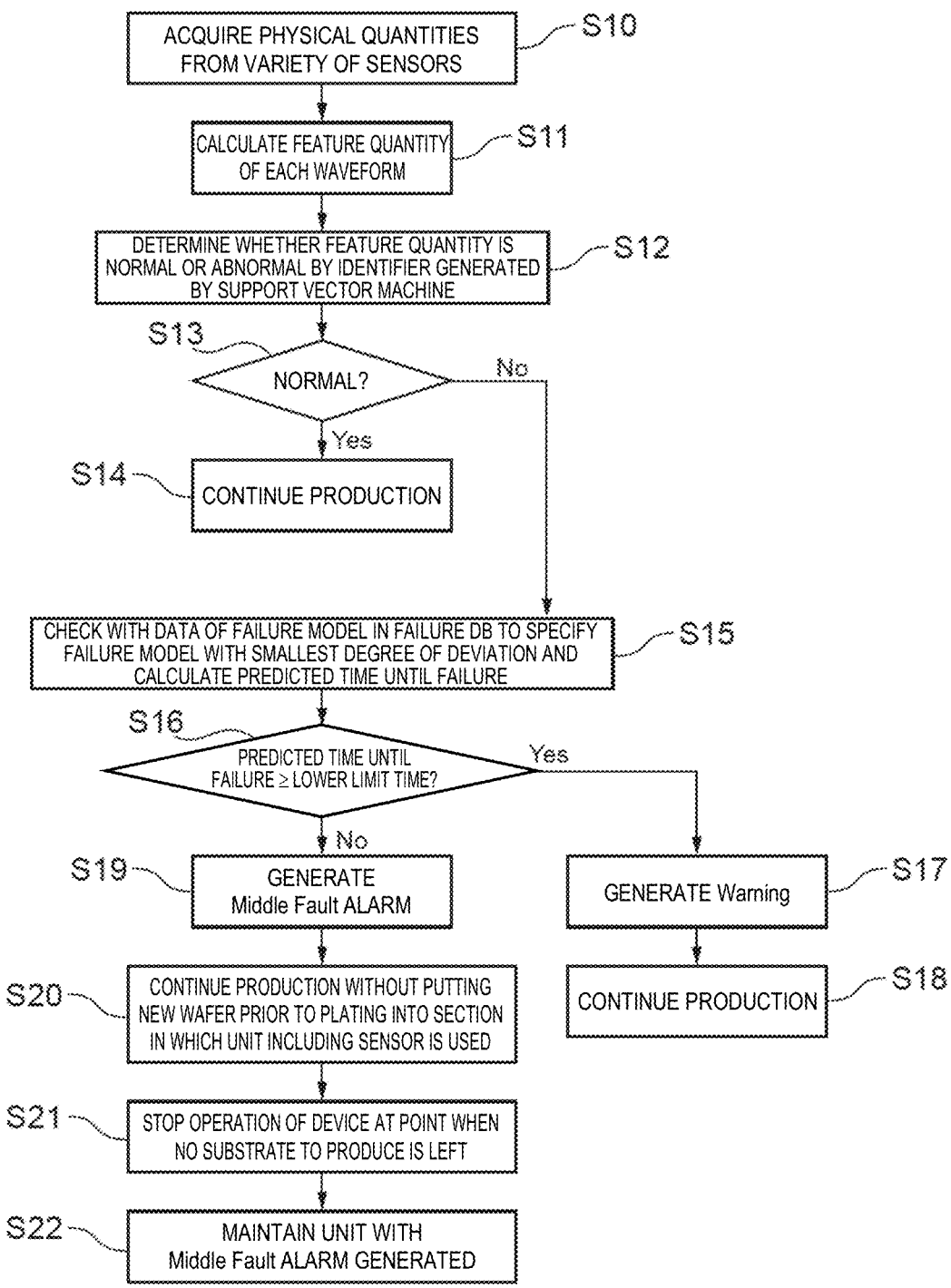
FIG. 11 is a flowchart of a failure detection process according to a first embodiment.

FIG. 11 is a flowchart of the failure detection process according to the first embodiment. In Step S10, physical quantities concerning the paddle device are acquired from a variety of sensors. For example, the physical quantities include at least a load factor of the motor 44, vibration of the motor 44, sound of the motor 44, a temperature of the motor 44, and shift of the shaft 38. In Step S11, a feature quantity is calculated from a waveform of each physical quantity to create a feature quantity vector. In Steps S12 and S13, it is determined whether the measured feature quantity is normal or abnormal by using an identifier generated by the support vector machine. In place of the identifier generated by the support vector machine, the Mahalanobis distance from the normal data set may be used to determine the normality or abnormality. When the measured feature quantity is normal as a result of the determination by Steps S12 and S13, the production is continued (Step S14). On the other hand, when the measured feature quantity is abnormal, the process is moved to Step S15.

In Step S15, the measured feature quantity is checked with each piece of failure model data in the failure database to specify a failure model data with the smallest degree of deviation. Using an analysis result of time series of that failure model (FIG. 10), the predicted time (tf–t1) until the failure is calculated. Note that a plurality of pieces of model data with relatively small degrees of deviation may be extracted and it may be determined that there are a plurality of possible abnormality generation portions. When there are a plurality of points with the same degree of deviation in FIG. 10, a point with the minimum predicted time until the failure is selected. When the determined failure model data includes a plurality of feature quantities, the minimum predicted time is selected among predicted time until the failure based on each feature quantity. When a plurality of pieces of failure model data are extracted, the minimum predicted time until the failure is selected.

In Step S16, it is determined whether the predicted time is not shorter than the lower limit time. When the predicted time is not shorter than the lower limit time, the process is moved to Step S17. When a plurality of pieces of failure model data are extracted in Step S15, a piece of failure model data with the minimum predicted time until the failure may be selected among the pieces of failure model data, and the selected piece of model data may be used in determination by the lower limit time. As described above, the predicted accumulated number of operations until the failure may be taken as the determination target in place of the predicted time until the failure. In this case, in place of the "predicted time" in Steps S15 and S16, a "predicted accumulated number of operations" is calculated (S15), and compared with the previously set lower limit time (S16).

In Step S17, a Warning alarm is generated. The Warning alarm is made by display on a display, a warning sound, or the like. In this case, the production in the plating apparatus is continued (Step S18).

In Step S16, when the predicted time is determined to be shorter than the lower limit time, a Middle Fault alarm is generated (Step S19). The Middle Fault alarm is made by display on a display, a warning sound, or the like. In this case, the production is continued without putting a new substrate prior to plating into a section (the plating cell 50 in this case) using the unit that includes the sensor having acquired the physical quantity of the feature quantity to be the determination target (Step S20). At the point in time when no substrate to produce is left, the operation of the plating apparatus is stopped (Step S21), and the unit with the middle Fault alarm generated is maintained or subject to a maintenance (Step S22).

In this example, alarms on two stages, Warning and Middle Fault, are generated in accordance with whether the predicted time is not smaller than the lower limit time, but alarms on three or more stages may be generated. For example, when the predicted time is shorter than a second lower limit time (<the above lower limit time), a Fault alarm may be generated and the device may be stopped immediately.

Further, the determination reference of the support vector machine may be updated as necessary. For example, when a unit with the Middle Fault alarm generated is maintained and the unit is actually not abnormal as a result of the maintenance, the determination reference of the support vector machine may be updated. Alternatively, the determination reference may be updated in other timing (regularly or irregularly). As a method for updating the determination reference of the support vector machine, the determination reference can be updated by, for example, reviewing each piece of data of the normal data set and the failure data set to delete some piece of data or acquire a new piece of data.

Second Embodiment (Flowchart)

Figure 12:
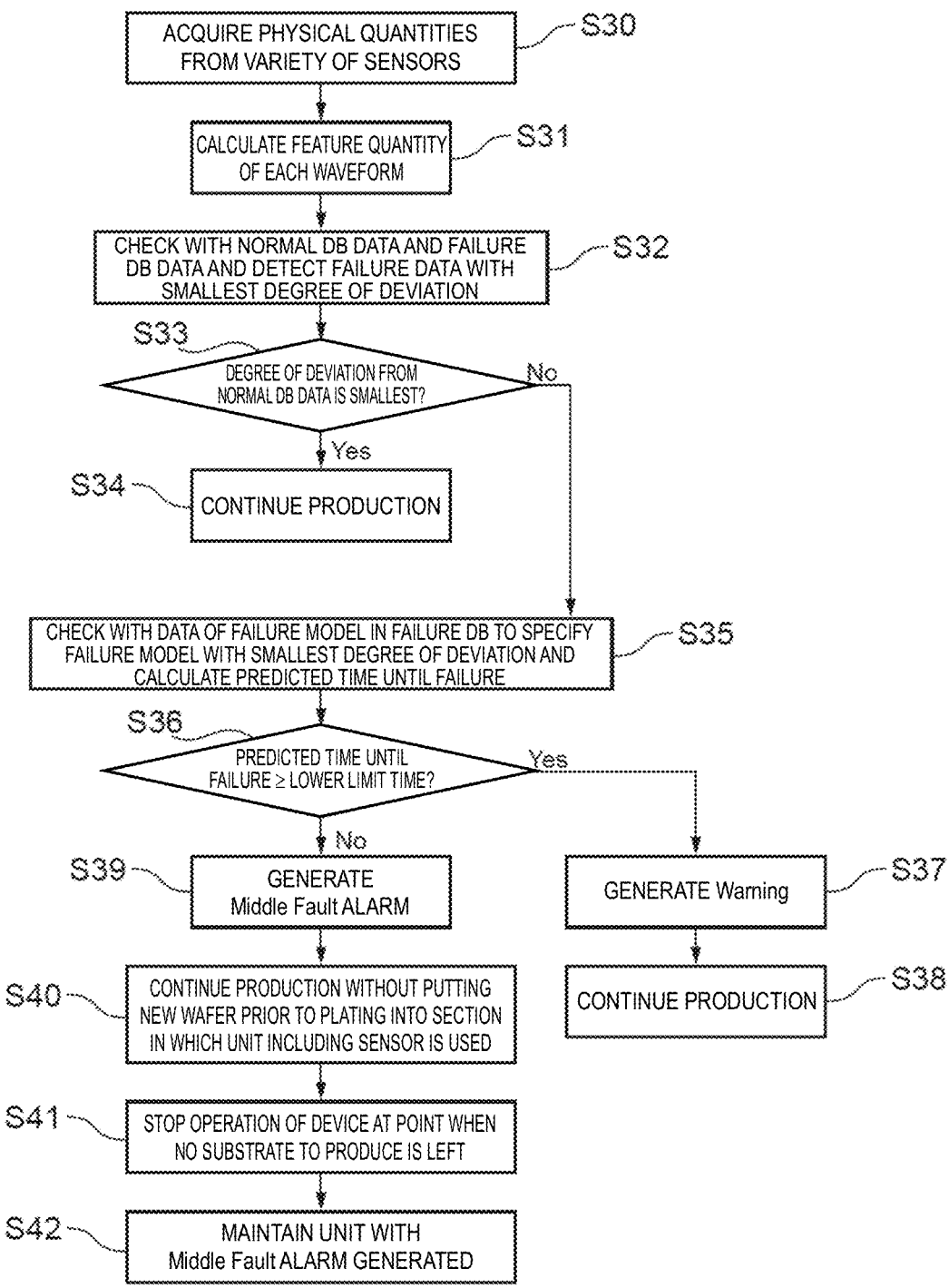
FIG. 12 is a flowchart of a failure detection process according to a second embodiment.

FIG. 12 is a flowchart of a failure detection process according to a second embodiment. In the present embodiment, the machine learning by using the support vector machine (S12 of FIG. 11) is not performed. The flowchart of FIG. 12 is the same as the flowchart of the first embodiment except that the processes of S12 and S13 of FIG. 11 are replaced by processes of S32 and S33. In Step S30, physical quantities concerning the paddle device are acquired from a variety of sensors. For example, the physical quantities include at least a load factor of the motor 44, vibration of the motor 44, sound of the motor 44, a temperature of the motor 44, and shift of the shaft 38. In Step S31, a feature quantity is calculated from a waveform of each physical quantity to create a feature quantity vector. In Steps S32 and S33, the measured feature quantity is checked with a previously prepared normal data set and failure data set, to search a set of pieces of data (normal data set, failure data set) with the smallest degree of deviation from the measured feature quantity. For calculation of this degree of deviation, the Mahalanobis distance can be used, for example. As a result, when the set of pieces of data with the smallest degree of deviation from the measured feature quantity is the normal data set, the production is continued (Step S34). On the other hand, when the set of pieces of data with the smallest degree of deviation from the measured feature quantity is the failure data set, the process is moved to Step S35.

In Step S35, a failure model with the smallest degree of deviation is specified. Specifically, the failure model, taken as having the smallest degree of deviation, is selected in Steps S32, S33. Using an analysis result of time series of that failure model (FIG. 10), the predicted time (tf−t1) until the failure is calculated.

In Step S36, it is determined whether the predicted time is not shorter than the lower limit time. When the predicted time is not shorter than the lower limit time, the process is moved to Step S37. As described above, the predicted accumulated number of operations until the failure may be taken as the determination target in place of the predicted time until the failure. In this case, in place of the "predicted time" in Steps S35 and S36, a "predicted accumulated number of operations" is calculated (S35), and compared with the previously set lower limit time (S36).

In Step S37, a Warning alarm is generated. The Warning alarm is made by display on a display, a warning sound, or the like. In this case, the production in the plating apparatus is continued (Step S38).

In Step S36, when the predicted time is determined to be shorter than the lower limit time, a Middle Fault alarm is generated (Step S39). The Middle Fault alarm is made by display on a display, a warning sound, or the like. In this case, the production is continued without putting a new substrate prior to plating into a section (the plating cell 50 in this case) using the unit that includes the sensor having acquired the physical quantity of the feature quantity to be the determination target (Step S40). At the point in time when no substrate to produce is left, the operation of the plating apparatus is stopped (Step S41), and the unit with the middle Fault alarm generated is maintained or subject to a maintenance (Step S42).

In this example, alarms on two stages, Warning and Middle Fault, are generated in accordance with whether the predicted time is not smaller than the lower limit time, but alarms on three or more stages may be generated. For example, when the predicted time is shorter than a second lower limit time, a Fault alarm may be generated and the device may be stopped immediately.

Further, the determination reference (the lower limit time of S36) may be updated as necessary. For example, when a unit with the Middle Fault alarm generated is maintained and the unit is actually not abnormal as a result of the maintenance, the determination reference (the lower limit time of S36) may be updated. The determination reference may be updated in other timing (regularly or irregularly). As a method for updating the determination reference (the lower limit time of S36), the determination reference can be updated by, for example, reviewing each piece of data of the normal data set and the failure data set to delete some piece of data or acquire a new piece of data.

Third Embodiment

In the above embodiment, the failure portion and the predicted time until the failure have been determined based on the comparison with the previously registered plurality of pieces of failure models. However, in the present embodiment, the failure prediction is performed based on a change in degree of deviation from the normal data set of the feature quantity.

Figure 13:
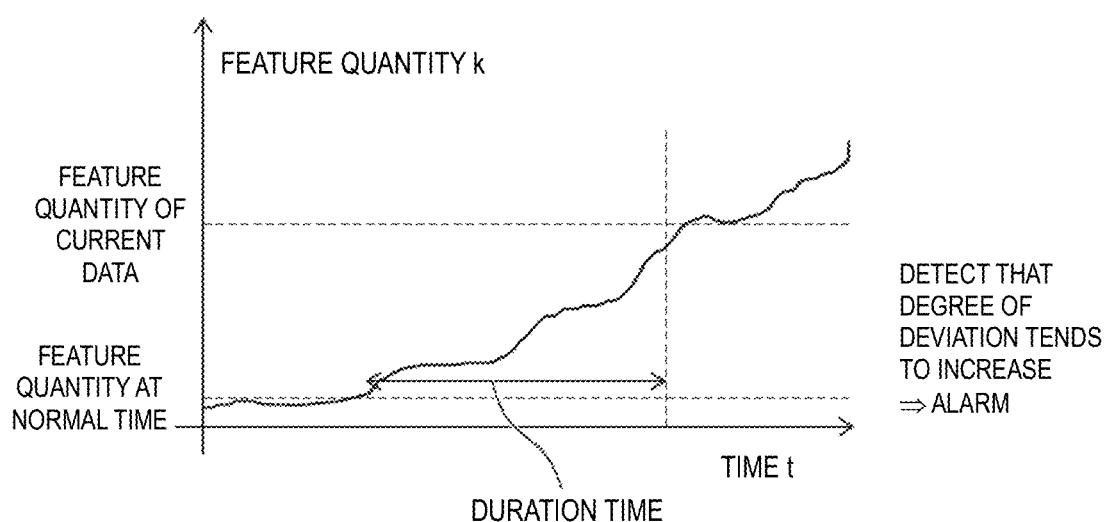
FIG. 13 is a measurement example of a temporal change in feature quantity.

FIG. 13 is a measurement example of a temporal change in feature quantity. In the same figure, a horizontal axis indicates operation time and a vertical axis indicates a feature quantity. In the present embodiment, when the measured feature quantity deviates from the feature quantity at the normal time and the degree of deviation tends to increase, the measured feature quantity is determined as abnormal. Specifically, the feature quantity samples at the normal time and a waveform data package at that time are previously registered into the database as the normal data set. The degree of deviation between a feature quantity vector of every piece of the normal data registered in the data base and a feature quantity vector of the current piece of data being the determination target is calculated. Upon detection that the degree of deviation tends to increase, the Middle Fault alarm is generated when the duration time exceeds the upper limit time, and the Warning alarm is generated when the duration time is below the upper limit value. When the degree of deviation repeats an abrupt increase and decrease discretely, an upper limit value (upper limit frequency) may be applied with respect to a frequency of increase in degree of deviation, in place of the duration time. The Middle Fault alarm is generated when the frequency of increase in degree of deviation exceeds the upper limit frequency, and the Warning alarm is generated when the frequency of increase in degree of deviation is below the upper limit frequency. It is possible to detect that the degree of deviation tends to increase by monitoring a value of the degree of deviation at certain time interval while approximating the value by a movement average. For example, the inclination is obtained by the least-square method, and when the inclination obtained by the least-square method is positive, the degree of deviation is determined to be increasing. In a case where there are a plurality of pieces of normal data, the Middle Fault alarm may be generated when the duration time for which the degrees of deviation from the all pieces of normal data tend to increase (or the frequencies of increase in degree of deviation) exceeds the upper limit value, or when the frequencies of increase in degree of deviation from the all pieces of data exceed the upper limit value.

Figure 14:
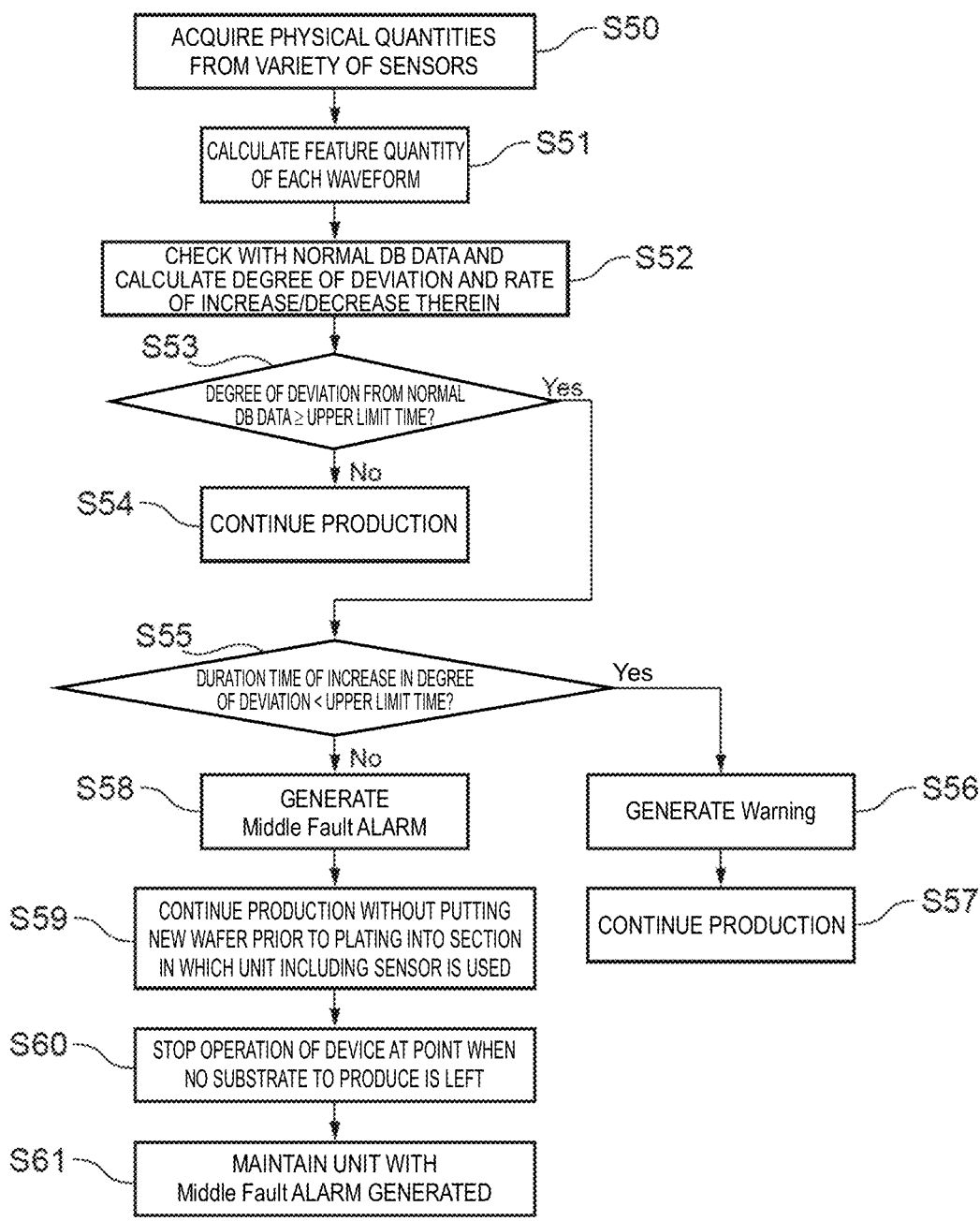
FIG. 14 is a flowchart of a failure detection process according to a third embodiment.

FIG. 14 is a flowchart of a failure detection process according to a third embodiment. In Step S50, physical quantities concerning the paddle device are acquired from a variety of sensors. For example, the physical quantities include at least a load factor of the motor 44, vibration of the motor 44, sound of the motor 44, a temperature of the motor 44, and shift of the shaft 38. In Step S51, a feature quantity is calculated from a waveform of each physical quantity to create a feature quantity vector. In Step S52, the measured feature quantity (feature quantity vector) is checked with a previously prepared normal data set, to calculate the degree of deviation between the measured feature quantity and the normal data set, and/or a rate of increase/decrease in degree of deviation. In Step S53, it is determined whether the degree of deviation of the measured feature quantity from the normal data set (or the rate of increase/decrease in degree of deviation) is not smaller than a previously set upper limit value. When the degree of deviation (or the rate of increase/decrease in degree of deviation) is determined to be smaller than the upper limit value, the production is continued (Step S54). On the other hand, when the degree of deviation (or the rate of increase/decrease in degree of deviation) is determined not to be smaller than the upper limit value, the process is moved to Step S55.

In Step S55, based on the temporal change in rate of increase/decrease in degree of deviation, it is determined whether or not the duration time for which the degree of deviation is increasing (the degree of deviation tends to increase) is shorter than the upper limit time. When the duration time for the increase in degree of deviation is determined to be shorter than the upper limit time, the process is moved to Step S56. When there are a plurality of pieces of normal data, it may be determined whether or not the duration time for which the degrees of deviation from the all pieces of normal data (or the rate of increase/decrease in degree of deviation) are smaller than the upper limit time.

In Step S56, a Warning alarm is generated. The Warning alarm is made by display on a display, a warning sound, or the like. In this case, the production in the plating apparatus is continued (Step S57).

In Step S55, when the duration time for the increase in degree of deviation is determined to be not shorter than the upper limit time, a Middle Fault alarm is generated (Step S58). The Middle Fault alarm is made by display on a display, a warning sound, or the like. In this case, the production is continued without putting a new substrate prior to plating into a section (the plating cell 50 in this case) using the unit that includes the sensor having acquired the physical quantity of the feature quantity to be the determination target (Step S59). At the point in time when no substrate to produce is left, the operation of the plating apparatus is stopped (Step S60), and the unit with the middle Fault alarm generated is maintained or subject to a maintenance (Step S61).

In this example, alarms on two stages, Warning and Middle Fault, are generated in accordance with whether or not the duration time for the increase in degree of deviation is not shorter than the upper limit time, but alarms on three or more stages may be generated. For example, when the duration time for the increase in degree of deviation is not shorter than a second upper limit time (>the above upper limit time), a Fault alarm may be generated and the device may be stopped immediately.

Further, the upper limit value of the degree of deviation (S53) and the upper limit time (S55) may be updated as necessary. For example, when a unit with the Middle Fault alarm generated is maintained and the unit is actually not abnormal as a result of the maintenance, the upper limit value of the degree of deviation (S53) and the upper limit time (S55) may be updated. Alternatively, the determination reference may be updated in other timing (regularly or irregularly). As an example of the method for setting and updating the upper limit value (S53) of the degree of deviation, a distribution of feature quantities calculated from a large number of normal data samples is assumed to be a regular distribution and a standard deviation ($\sigma$) value is calculated, so that an upper limit based on the $\sigma$ value (or two or three $\sigma$ values) can be set. Specifically, by using an average value of feature quantities calculated from a plurality of normal data samples and a value of a feature quantity corresponding to (average $\pm\sigma$), the degree of deviation of the (average $\pm\sigma$) value with respect to the average value is calculated and set as the upper limit value. Further, a normal sample data newly acquired on a daily basis is added to enable updating of the upper limit value from the accumulated normal data samples.

Fourth Embodiment

Figure 15:
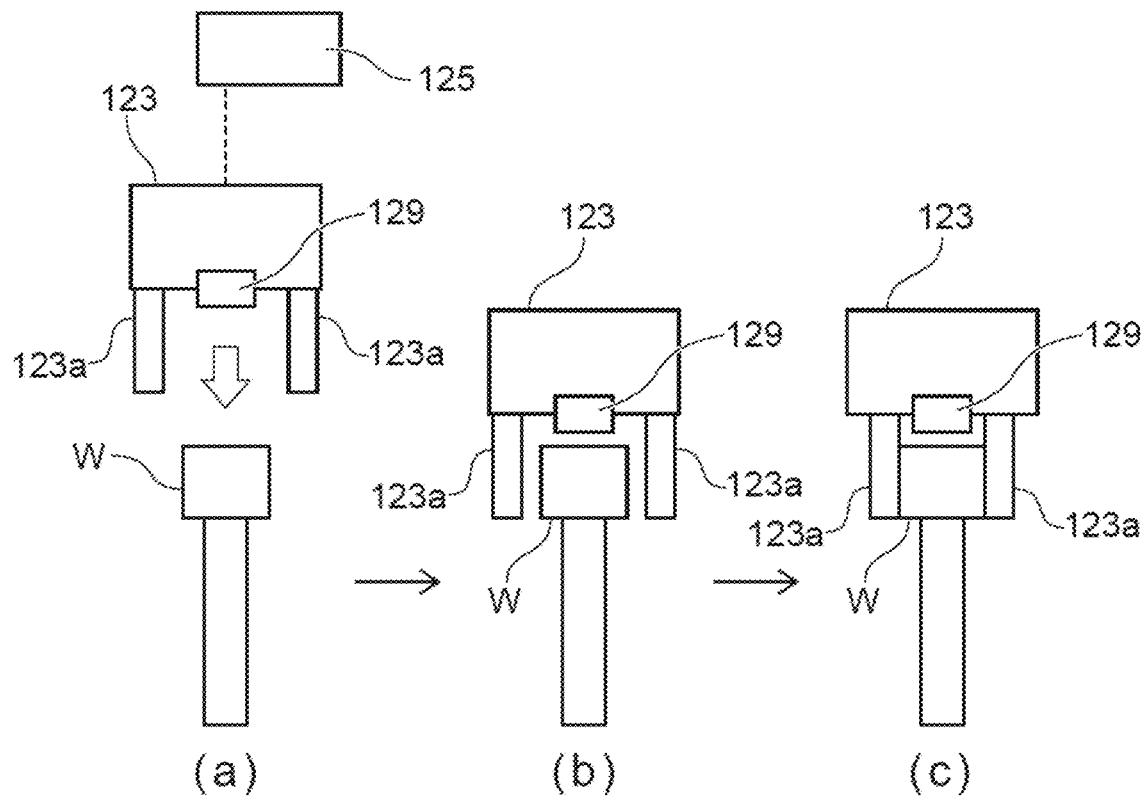
FIG. 15 shows explanatory views for explaining detection of grasping of a substrate by a robot hand.
Figure 16:
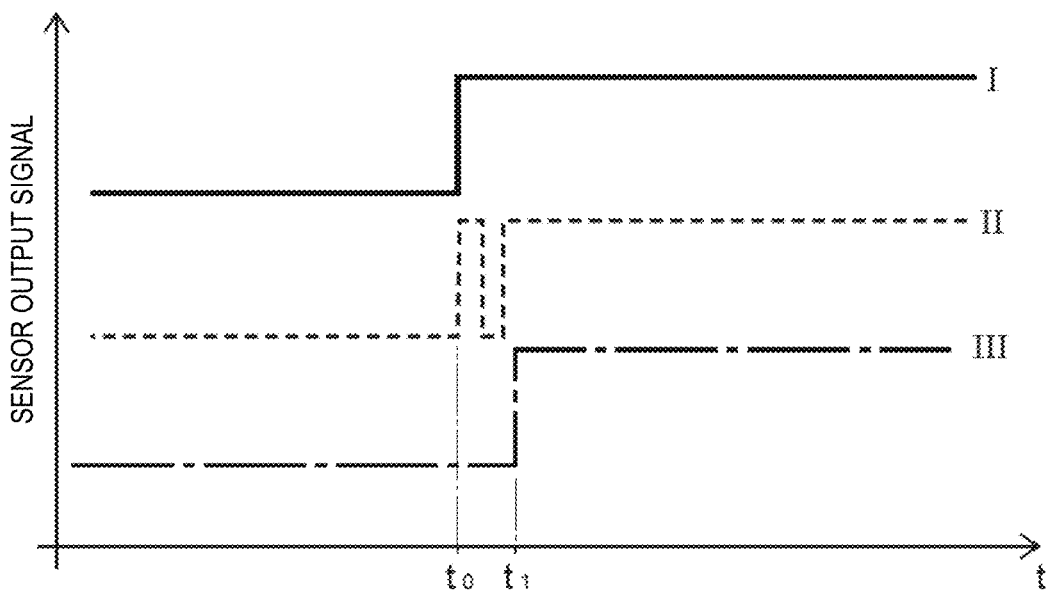
FIG. 16 is a time chart of a sensor output signal.

FIG. 15 shows explanatory views for explaining detection of grasping of the substrate by a robot hand. FIG. 16 is a time chart of a sensor output signal. A robot hand 123 is, for example, a robot hand of a carrier robot of the substrate carrier device 122. This robot hand 123 performs rotary/linear movement, vertical movement, and grasping operation by using a driving device 125 including the motor and the like. The robot hand 123 includes a sensor 129 (e.g. optical sensor) that detects hold of the substrate W, and when the robot hand 123 holds the substrate W (FIG. 15C), a detection signal is generated as a sensor output signal (FIG. 16). The substrate W is grasped such that hook portions 123a of the robot hand 123 sandwich the substrate W. The hook portions 123a are driven by power of an air cylinder, a motor, or the like, so as to approach and separate from each other.

When the substrate W is grasped by the robot hand 123, first, the robot hand 123 is moved to a space above the substrate W (FIG. 15A). Next, the robot hand 123 is lowered until the substrate W is located between the two hook portions 123a, which are in an open state (FIG. 15B). Thereafter, the hook portions 123a of the robot hand 123 move so as to approach each other, and sandwich and grasp the substrate W (FIG. 15C). At this time, the sensor 129 detects the grasping of the substrate W.

With reference to FIG. 16, a description will be given of characteristics of an output signal in the cases of the sensor 129 being normal and abnormal. In the same figure, a horizontal axis is time, and a vertical axis is a sensor output signal. A time t0 is timing of grasping of the substrate W by the hook portions 123a which is recognized from a drive signal to the power source, such as the air cylinder or the motor, for driving the hook portions 123a of the robot hand 123. This drive signal is ascertained by the controller 175, for example.

When the sensor 129 is normal, as indicated by a curve I in FIG. 16, the hook portions 123a of the robot hand 123 grasps the substrate W at the time t0, and simultaneously with that, a detection signal is outputted from the sensor 129. When abnormality is generated in the sensor 129, a time t1, at which chattering may occur in the detection signal from the sensor 129 as indicated by a curve II or a detection signal is generated by a curve III, is delayed from the time t0. Note that the abnormality of the sensor includes sensitivity degradation and adjustment defects of the sensor, and the sensor is determined to be abnormal in the case of the sensitivity degradation or the adjustment defects of the sensor.

The failure prediction process of the sensor will be described below. First, an operation waveform of the sensor 129 (FIG. 16) is limited to the sensor operating time and acquired (detection of a physical quantity). Next, at least one of a sensor-on delay time, an on/off number of chatterings, and on/off duration time is calculated from the sensor operation waveform as a feature quantity (calculation of a feature quantity). The occurrence of the detection signal by the sensor is expressed as the sensor-on. The sensor-on delay time is time corresponding to t0-t1 in FIG. 16. The on/off number of chatterings shows the number of switchings to off until the sensor output signal is stably held on, as indicated by the curve II of FIG. 16. The on/off duration time is the time for which the sensor output signal repeats on/off as indicated by the curve II of FIG. 16.

(Learning by Support Vector Machine)

The machine learning is performed by a support vector machine by using the above feature quantity (at least one of the sensor-on delay time, the on/off number of chatterings, and the on/off duration time). Note that the support vector machine is configured as a program to be run in the controller 175, the control unit 46 and/or another computer (inside and/or outside the plating apparatus), for example.

The machine learning in the support vector machine is performed as follows:

(1) a plurality of feature quantity samples at the normal time and a plurality of feature quantity samples at the time of failure are prepared and defined as a normal data set and a failure data set, respectively.

(2) An identifier is generated by learning with the support vector machine, using the defined normal data set and failure data set as training samples. The identifier is generated as a program to be run in the computer.

(Normality/Abnormality Determination)

During the grasping operation of the robot hand 123, a newly measured feature quantity is determined by the identifier generated by the support vector machine. When the feature quantity (the operation state of the sensor 129) is determined as abnormal as a result of the determination, a Fault alarm or a Warning alarm is generated. In the present specification, the term "failure" is defined as a state in which a part or all of constituent equipment (device) is broken and its function is damaged. The term "abnormality" is defined as a state in which the function has deteriorated as compared with that at the normal time or the function is damaged. That is, the state of "abnormality" includes the state of "failure". In the present embodiment, a concept that abnormality is Middle Fault, being a situation prior to a failure, is used. In place of the identifier generated by the support vector machine, the Mahalanobis distance from the normal data set may be used to determine the normality or abnormality.

(Calculation of Predicted Failure Time)

The feature quantity samples at the time of failure described above in the learning performed by the support vector machine and a waveform data package at that time are previously registered into the database. That is, a temporal change in feature quantities from the normal state to the failure state is registered as a failure model (failure model data) with respect to each failure event (failure type). This database can be stored into a memory provided in the controller 175, the control unit 46, or another computer, or another memory. A change in feature quantity concerning the failure data is analyzed using a time series, and that data is registered as well. A change in feature quantity concerning the failure data is analyzed using a time series, and that data (cf. FIG. 10) is registered as well.

When the feature quantity is determined as abnormal in the normality/abnormality determination described above, a difference (a degree of deviation) between a feature quantity vector at each point in time of all pieces of the failure model data registered in the database and a feature quantity vector of the current data of a determination target is calculated based on [Math. 1] described above. The degree of deviation can be the Mahalanobis distance, for example.

Failure model data with the smallest degree of deviation from the feature quantity of the current data of the determination target is determined as the most possible abnormality generation portion (failure model). Note that a plurality of pieces of model data with relatively small degrees of deviation may be extracted and it may be determined that there are a plurality of possible abnormality generation portions. Further, in the determined failure model, predicted time until the failure is calculated from a difference (tf–t1) between a failure generated time tf and a time t1, at which the degree of deviation from the current data of the determination target is the smallest, by using the temporal change data of FIG. 10, for example.

When there are a plurality of points with the same degree of deviation in FIG. 10, a point with the minimum predicted time until the failure is selected. When the determined failure model data includes a plurality of feature quantities, the minimum predicted time is selected among predicted time until the failure based on each feature quantity. When a plurality of pieces of failure model data are extracted, the minimum predicted time until the failure is selected.

When the predicted time is shorter than the lower limit time, the Middle Fault alarm is generated so as not to receive a new substrate. When the predicted time until the failure is not shorter than the lower limit time, the Warning alarm is generated and the production is continued. The lower limit time can, for example, be the time obtained by providing a predetermined margin to the plating treatment time for one substrate, or the time obtained by providing a predetermined margin to the time when the plating treatment on all the substrates carried into the plating apparatus can be completed. When a plurality of pieces of failure model data with relatively small degrees of deviation are extracted and it is determined that there are a plurality of possible abnormality generation portions, a piece of failure model data with the minimum predicted time until the failure may be selected among the pieces of failure model data. As described above, the predicted accumulated number of operations until the failure may be calculated in place of, or in addition to, the predicted time until the failure, and notify the predicted time and/or the accumulated number of operations.

(Flowchart)

Figure 17:
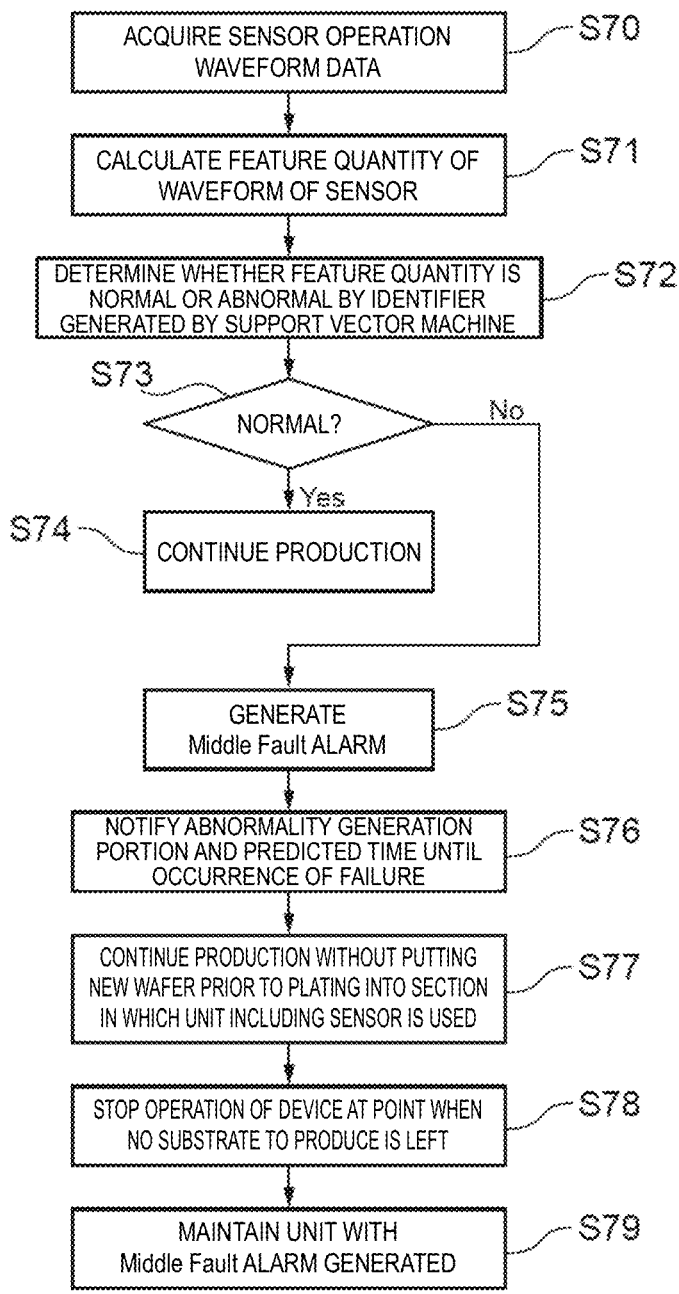
FIG. 17 is a flowchart of a failure detection process according to a fourth embodiment.

FIG. 17 is a flowchart of a failure detection process according to a fourth embodiment. In Step S70, an operation waveform of the sensor is limited to the sensor operating time and acquired. In Step S71, at least one of a sensor-on delay time, an on/off number of chatterings, and on/off duration time is calculated from the sensor operation waveform as a feature quantity, and a feature quantity vector is created. In Steps S72 and S73, it is determined whether the measured feature quantity is normal or abnormal by using an identifier generated by the support vector machine. In place of the identifier generated by the support vector machine, the Mahalanobis distance from the normal data set may be used to determine the normality or abnormality. When the measured feature quantity is normal as a result of the determination by Steps S72 and S73, the production is continued (Step S74). On the other hand, when the measured feature quantity is abnormal, the process is moved to Step S75.

In Step S75, a Middle Fault alarm is generated, and the process is moved to Step S76. The Middle Fault alarm is made by display on a display, a warning sound, or the like.

In Step S76, the measured feature quantity is checked with each piece of failure model data previously registered into the failure database to specify a failure model data with the smallest degree of deviation. Note that a plurality of pieces of model data with relatively small degrees of deviation may be extracted and it may be determined that there are a plurality of possible abnormality generation portions. Using an analysis result of time series of that failure model (FIG. 10), the predicted time until the failure is calculated and notified. The predicted time is notified by display on a display, a warning sound, or the like. When there are a plurality of points with the same degree of deviation in FIG. 10, a point with the minimum predicted time until the failure is selected. When the determined failure model data includes a plurality of feature quantities, the minimum predicted time is selected among predicted time until the failure based on each feature quantity. When a plurality of pieces of failure model data are extracted, the minimum predicted time until the failure is selected. Note that the predicted accumulated number of operations until the failure may be calculated in place of, or in addition to, the predicted time until the failure, and notify the predicted time and/or the accumulated number of operations.

Further, the production is continued without putting a new substrate prior to plating into a section (the substrate carrier device 122 in this case) using the unit that includes the sensor having acquired the physical quantity of the feature quantity to be the determination target (Step S77). At the point in time when no substrate to produce is left, the operation of the plating apparatus is stopped (Step S78), and the unit with the middle Fault alarm generated is maintained or subject to a maintenance (Step S79).

Although the example of the sensor of the robot hand in the substrate carrier device 122 of the plating apparatus has been cited here, the application is possible also to a sensor of another robot hand or a freely selectable sensor of a device other than the robot.

Fifth Embodiment (Flowchart)

Figure 18:
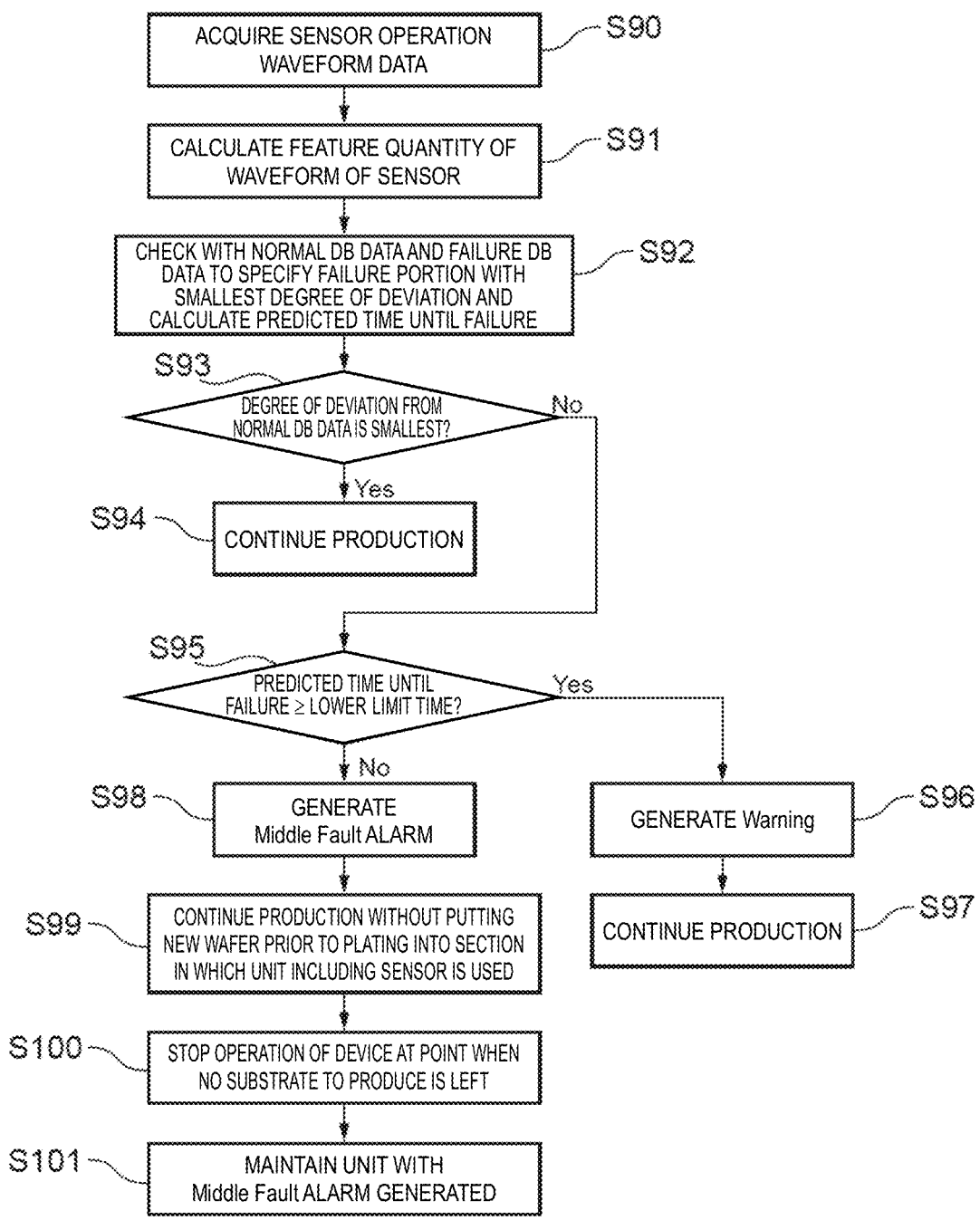
FIG. 18 is a flowchart of a failure detection process according to a fifth embodiment.

FIG. 18 is a flowchart of a failure detection process according to a fifth embodiment. In Step S90, an operation waveform of the sensor is limited to the sensor operating time and acquired. In Step S91, at least one of a sensor-on delay time, an on/off number of chatterings, and on/off duration time is calculated from the sensor operation waveform as a feature quantity, and a feature quantity vector is created. In Step S92, the measured feature quantity is checked with a previously prepared normal data set and failure data set, to search a set of pieces of data with the smallest degree of deviation from the measured feature quantity. For calculation of this degree of deviation, the Mahalanobis distance can be used, for example. The failure data set (failure portion) with the smallest degree of deviation is specified, and an analysis result of time series of that failure model (FIG. 10) is used to calculate the predicted time (tf−t1) until the failure. In Step S93, when the set of pieces of data with the smallest degree of deviation from the measured feature quantity is the normal data set, the production is continued (Step S94). On the other hand, when the set of pieces of data with the smallest degree of deviation from the measured feature quantity is the failure data set, the process is moved to Step S95. In Step S95, it is determined whether the predicted time until the failure, calculated in Step S92, is not shorter than the lower limit time. When the predicted time is not shorter than the lower limit time, the Warning is generated (Step S96) and the production is continued (Step S97). On the other hand, in Step S95, when the predicted time is shorter than the lower limit time, the Middle Fault alarm is generated (Step S98). As described above, the predicted accumulated number of operations until the failure may be taken as the determination target in place of the predicted time until the failure. In this case, in place of the "predicted time" in Steps S92 and S95, a "predicted accumulated number of operations" is calculated (S92), and compared with the previously set lower limit time (S95). The Middle Fault alarm is made by display on a display, a warning sound, or the like. In this case, the production is continued without putting a new substrate prior to plating into a section (the substrate carrier device 122 in this case) using the unit that includes the sensor (Step S99). At the point in time when no substrate to produce is left, the operation of the plating apparatus is stopped (Step S100), and the unit with the middle Fault alarm generated is maintained or subject to maintenance (Step S101).

In this example, alarms on two stages, Warning and Middle Fault, are generated in accordance with whether the predicted time is not smaller than the lower limit time, but alarms on three or more stages may be generated. For example, when the predicted time is shorter than a second lower limit time (<the above lower limit time), a Fault alarm may be generated and the device may be stopped immediately.

Further, the determination reference (the lower limit time of S95) may be updated as necessary. For example, when a unit with the Middle Fault alarm generated is maintained and the unit is actually not abnormal as a result of the maintenance, the determination reference (the lower limit time of S95) may be updated. The determination reference may be updated in other timing (regularly or irregularly). As a method for updating the determination reference (the lower limit time of S95), the determination reference can be updated by, for example, reviewing each piece of data of the normal data set and the failure data set to delete some piece of data or acquire a new piece of data.

Sixth Embodiment

Figure 19:
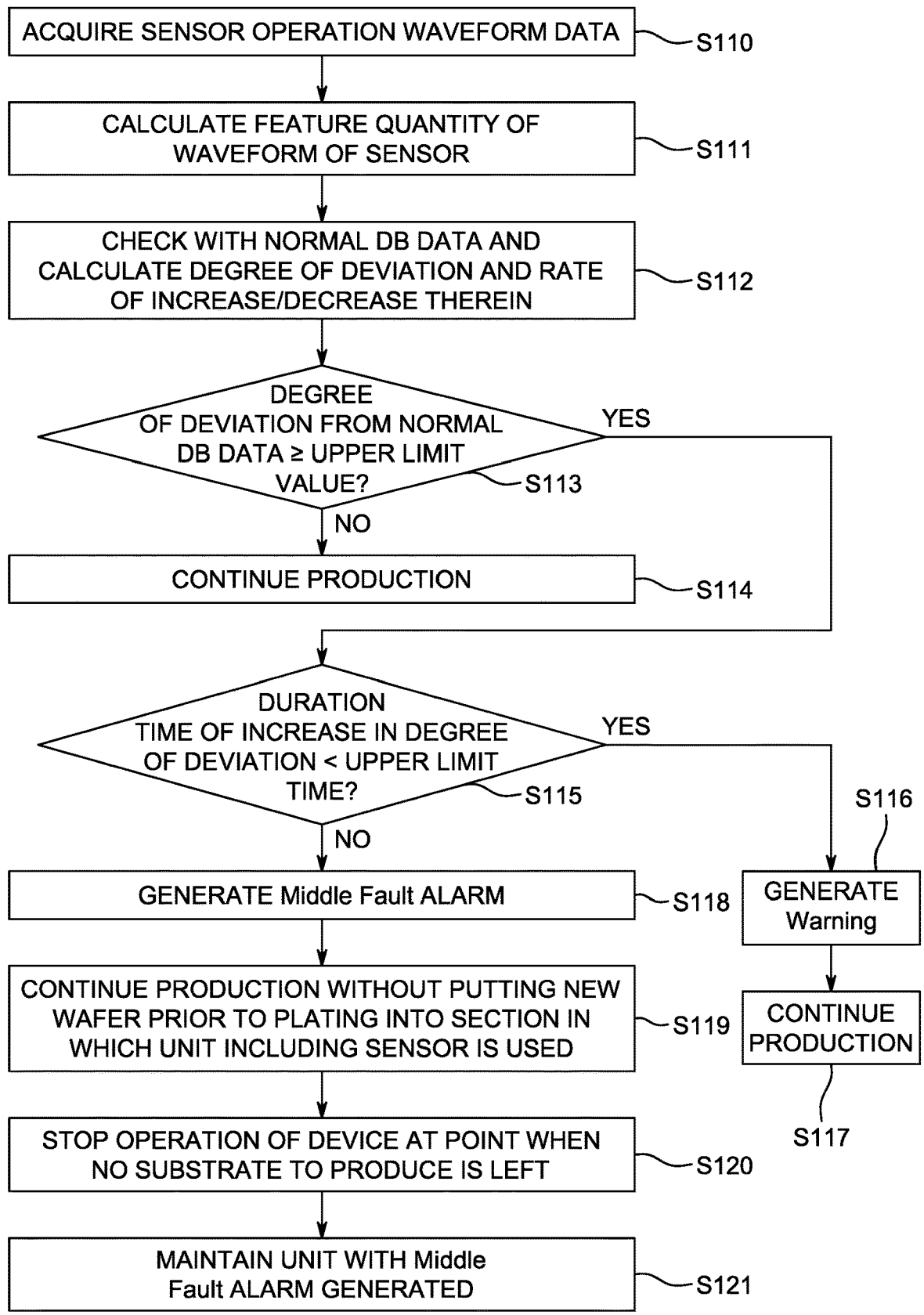
FIG. 19 is a flowchart of a failure detection process according to a sixth embodiment.

FIG. 19 is a flowchart of a failure detection process according to a sixth embodiment. In Step S110, an operation waveform of the sensor is limited to the sensor operating time and acquired. In Step S111, at least one of a sensor-on delay time, an on/off number of chatterings, and on/off duration time is calculated from the sensor operation waveform as a feature quantity, and a feature quantity vector is created. In Step S112, the measured feature quantity (feature quantity vector) is checked with a previously prepared normal data set, to calculate the degree of deviation between the measured feature quantity and the normal data set, and/or a rate of increase in degree of deviation. In Step S113, it is determined whether the degree of deviation of the measured feature quantity from the normal data set (or the rate of increase/decrease in degree of deviation) is not smaller than a previously set upper limit value. When the degree of deviation (or the rate of increase/decrease in degree of deviation) is determined to be smaller than the upper limit value, the production is continued (Step S114). On the other hand, when the degree of deviation (or the rate of increase/decrease in degree of deviation) is determined not to be smaller than the upper limit value, the process is moved to Step S115.

In Step S115, based on the temporal change in rate of increase/decrease in degree of deviation, it is determined whether or not the duration time for which the degree of deviation is increasing (the degree of deviation tends to increase) is shorter than the upper limit time. When the duration time for the increase and decrease in degree of deviation is determined to be shorter than the upper limit time, the process is moved to Step S116. When there are a plurality of pieces of normal data, it may be determined whether or not the duration time for which the degrees of deviation from the all pieces of normal data (or the rate of increase/decrease in degree of deviation) are smaller than the upper limit time. In Step S116, a Warning alarm is generated. The Warning alarm is made by display on a display, a warning sound, or the like. In this case, the production in the plating apparatus is continued (Step S117).

In Step S115, when the duration time for the increase in degree of deviation is determined to be not shorter than the upper limit time, a Middle Fault alarm is generated (Step S118). The Middle Fault alarm is made by display on a display, a warning sound, or the like. In this case, the production is continued without putting a new substrate prior to plating into a section (the substrate carrier device 122 in this case) using the unit that includes the sensor (Step S119). At the point in time when no substrate to produce is left, the operation of the plating apparatus is stopped (Step S120), and the unit with the middle Fault alarm generated is maintained or subject to a maintenance (Step S121).

In this example, alarms on two stages, Warning and Middle Fault, are generated in accordance with whether or not the duration time for the increase in degree of deviation is not shorter than the upper value time, but alarms on three or more stages may be generated. For example, when the duration time for the increase in degree of deviation is not shorter than a second upper limit time (>the above upper limit time), a Fault alarm may be generated and the device may be stopped immediately.

Further, as described above in the third embodiment, the upper limit value of the degree of deviation (S113) and the upper limit time (S115) may be updated as necessary.

Other Embodiments

Although the failure detection process has been applied to the paddle device 180 of the plating apparatus in the above embodiments, the above embodiments are also applicable to a configuration of each unit (including the drive unit and the sensor) of the plating apparatus and another semiconductor manufacturing apparatus. For example, the above embodiments are applicable to a motor and a sensor included in the substrate setting/removing unit (fixing station) 120 and to a motor of an actuator that drives a transporter such as the substrate holder carrier device 140. Examples of the substrate setting/removing unit 120 include a unit described in Japanese Patent Laid-Open No. 2016-127069. Examples of the transporter is a unit described in Japanese Patent Laid-Open No. 2014-169475.

Figure 20:
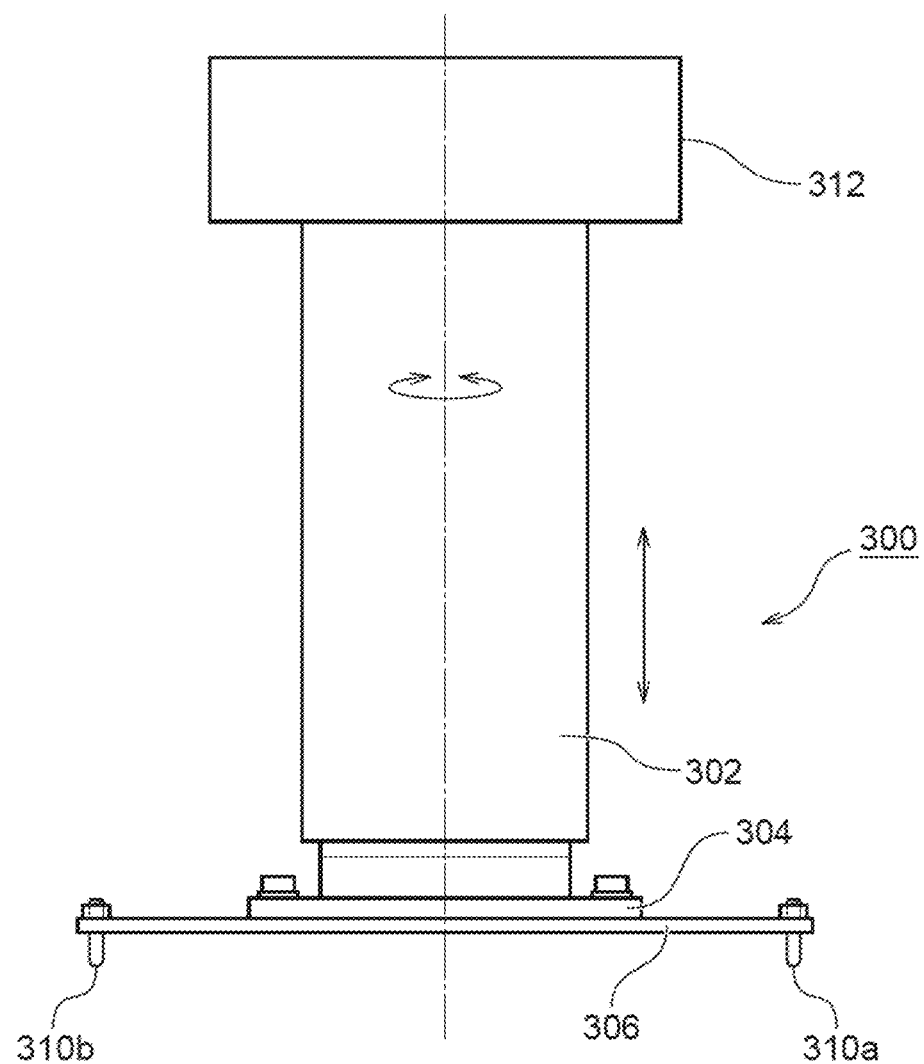
FIG. 20 is a schematic side view of a substrate holder setting/removing device in a substrate setting/removing portion.

FIG. 20 is a schematic side view of a substrate holder setting/removing device 300 in the substrate setting/removing unit 120. The substrate holder setting/removing device 300 is a device that makes a second holding member (not shown) of the substrate holder 11 locked to a first holding member (not shown) thereof in a state where the substrate is placed in the first holding member, to hold the substrate in the substrate holder 11. The substrate holder setting/removing device 300 includes a shaft 302 configured to be axially movable and rotatable, a disk 304 fixed to the shaft 302, and a disk 306 fixed to the lower surface of the disk 304 and having a larger diameter than that of the disk 304. A plurality of holder locking pins 310a, 310b for rotating a ring-like press portion (not shown), provided in the second holding member of the substrate holder 11, are provided on the lower surface of the disk 306. The holder locking pins 310a, 310b are rotated by rotation of the shaft 302 by the motor 312, and the ring-like press portion of the second holding member of the substrate holder 11 is rotated and then engaged to a clamper of the second holding member, whereby the first and second holding members are locked. The failure prediction process in each of the embodiments described above is applicable to the motor 312 of the substrate holder setting/removing device 300. Further, the failure prediction process in each of the embodiments described above is also applicable to a linear mechanism that axially moves the shaft 302 and a variety of sensors included in the substrate setting/removing unit 120.

Figure 21:
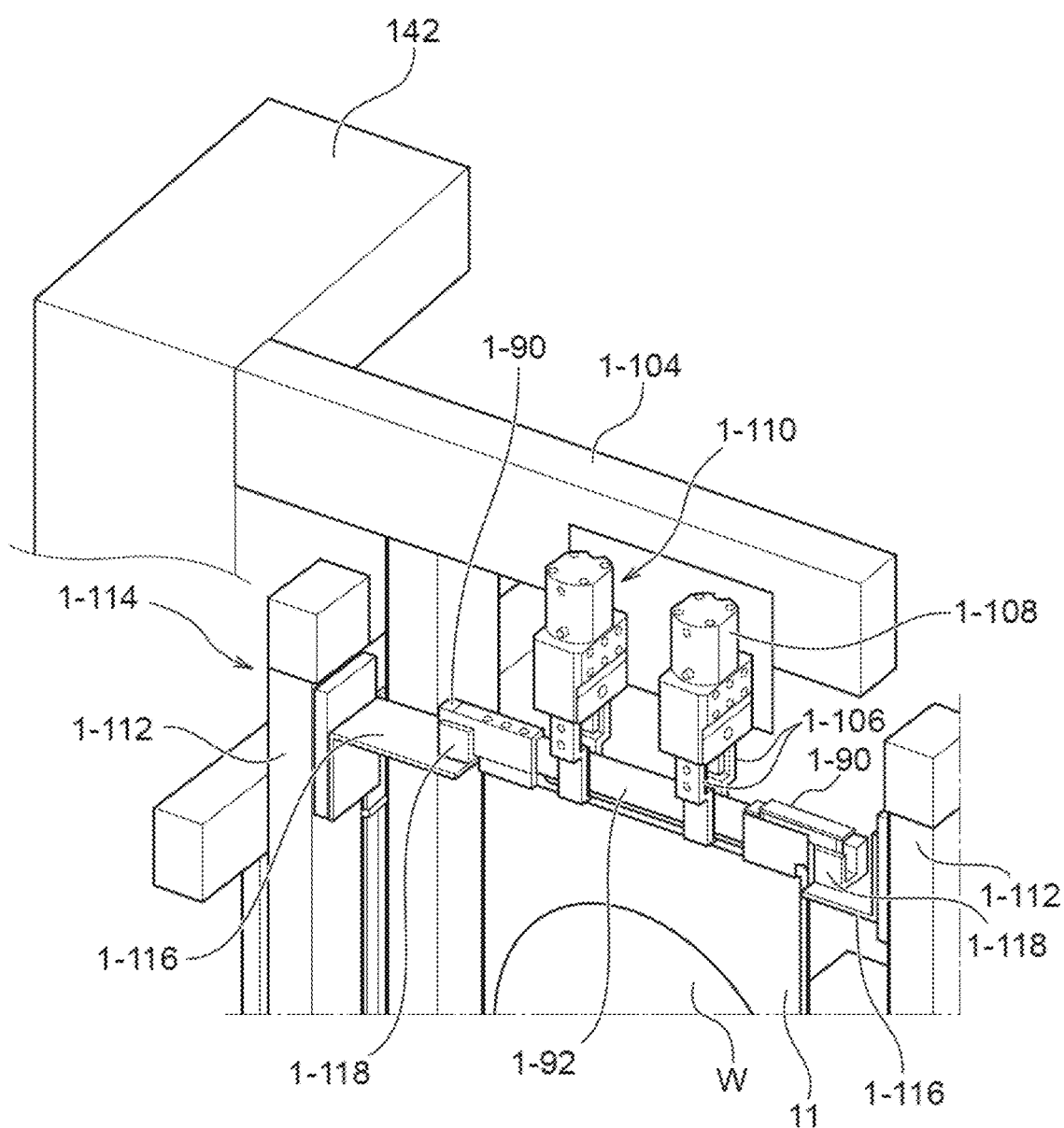
FIG. 21 is a schematic view of a transporter and a lifting mechanism.

FIG. 21 is a schematic view of a transporter and a lifting mechanism. A traveling actuator and a lifting actuator, not shown, are coupled or fitted to a first transporter 142. With these actuators, the first transporter 142 moves horizontally in a plating tank to lift and lower an arm 1-104. The actuator is made up of a motor and a rotary-to-linear conversion mechanism, such as a ball screw. It is possible to apply the failure prediction process in each of the embodiments described above to an actuator that moves the transporter as described above. As shown in FIG. 21, the first transporter 142 includes the arm 1-104, and a grasping mechanism 1-110 is provided in the arm 1-104. The grasping mechanism 1-110 includes a pair of chuck Jaws 1-106 that grasp the substrate holder 11 by sandwiching a hand lever 1-92 of the substrate holder 11 in the forward and backward directions, and an actuator 1-108 that moves the chuck Jaws 106 in directions of approaching or separating from each other. It is possible to apply the failure prediction process in each of the embodiments described above to the actuator 1-108 as above.

A fixed lifter 1-114 including a pair of actuators 1-112, vertically provided on each side of the tank, is provided in the first cleaning tank 130a. A lifting arm 1-116 that lifts and lowers along the actuator is coupled to each actuator 1-112. The lifting arm 1-116 is vertically moved by the motor and the rotary/linear mechanism such as the ball screw which are built in the actuator 1-112. A receiving stage 1-118, opened upward and having a rectangular shape in longitudinal section, is fixed to the lifting arm 1-116. The substrate holder 11 holding the substrate W is supported on the lifter 1-114 by insertion of a first step 1-90 of the holder hanger into the receiving stage 1-118. Further, the substrate holder 11 is lifted and lowered by the actuator 1-112. It is possible to apply the failure prediction process in each of the embodiments described above to the actuator 1-112 as above. Note that other units (the pre-wetting tank 126, the pre-soaking tank 128, the blow tank 132, and the second cleaning tank 130b) can be provided with similar mechanisms.

Figure 22:
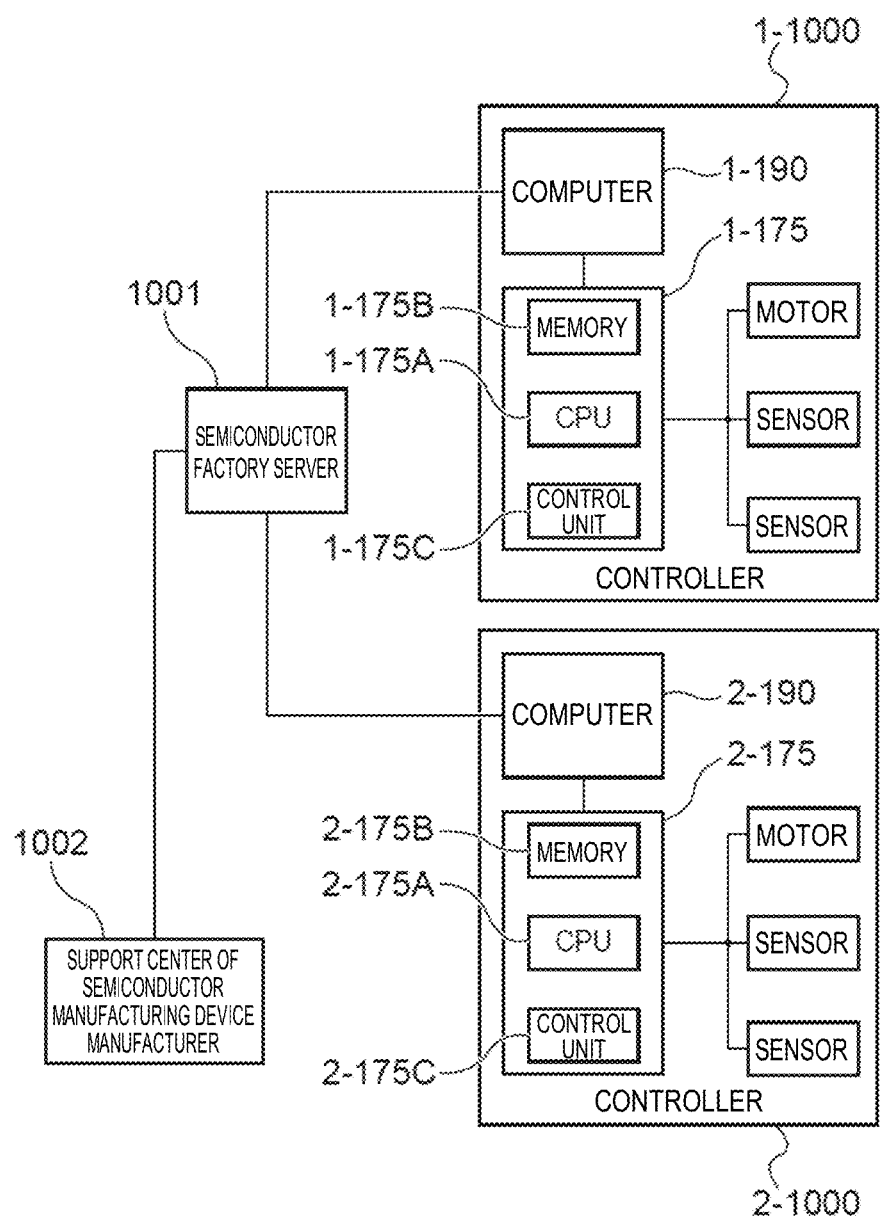
FIG. 22 is a schematic diagram showing one embodiment of a failure prediction method of each instrument in a semiconductor factory in which a plurality of semiconductor manufacturing apparatuses are provided.

FIG. 22 is a schematic diagram showing one embodiment of a failure prediction method of each equipment, such as a motor and a sensor of each of a plurality of semiconductor manufacturing apparatuses in a semiconductor factory in which the semiconductor manufacturing apparatuses are provided. The semiconductor manufacturing apparatus is, for example, a plating apparatus (described above), a polishing apparatus, or some other semiconductor manufacturing apparatus. FIG. 22 illustrates two semiconductor manufacturing apparatuses 1-1000, 2-1000. The number of semiconductor manufacturing apparatuses may be one or may be three or more. The semiconductor manufacturing apparatuses 1-1000, 2-1000 include controllers 1-175, 2-175, which are similar to the controller 175 described above.

In the present embodiment, the signals described above, generated by the motors and the sensors of the transporter, the fixing station, and the like of the semiconductor manufacturing apparatuses 1-1000, 2-1000, are transmitted to the controllers 1-175, 2-175, and the failure detection is performed in each equipment such as the sensor and the motor in the controllers 1-175, 2-175 and computers 1-190, 2-190. Further, operation data (sensor measurement data, load data of the servo motor, etc.) of the semiconductor manufacturing apparatus itself is transmitted to the controllers 1-175, 2-175 at predetermined time intervals or on a stationary basis. Part of the control unit 175C may be made up of hardware dedicated to an application specific integrated circuit such as an ASIC or a PLC. The controllers 1-175, 2-175 extract feature quantity data from the operation data described above to convert the data to easily analyzable data. In this manner, the controllers 1-175, 2-175 function to compress a data capacity and then predict a failure of the semiconductor manufacturing apparatus. The controllers 1-175, 2-175 are disposed in the semiconductor manufacturing apparatus or close to the semiconductor manufacturing apparatus.

Alternatively, in these controllers 1-175, 2-175, after conversion of the data to easily analyzable data, the converted data may be transmitted one after another or on a regular basis from the controllers 1-175, 2-175 to semiconductor factory server 1001 by wire or wirelessly (e.g. LAN). Alternatively, the controllers 1-175, 2-175 may be connected to the semiconductor factory server 1001 by radio communication via the computers 1-190, 2-190 including general communication equipment, and a cloud (not shown) connected to the computers 1-190, 2-190. Then, in the semiconductor factory server 1001, a failure of each equipment such as the sensor or motor of the each of the semiconductor manufacturing apparatuses 1-1000, 2-1000 may be predicted based on data received from the controller or the computer.

A direct command may be issued from an operator to a support center 1002 of a manufacturer of semiconductor manufacturing apparatuses based on a calculated predicted failure period of each equipment such as the sensor and the motor of each of the semiconductor manufacturing apparatuses 1-1000, 2-1000. Alternatively, by taking it as a trigger that it is a predetermined period prior to a calculated predicted failure point in time of each equipment such as the sensor and the motor of the semiconductor manufacturing apparatus, an order command for parts of the motor, the sensor, or the like which is predicted to fail may be automatically transmitted from the semiconductor factory server 1001 to the support center 1002 of the manufacturer of semiconductor manufacturing apparatuses, so that the number of parts required are previously transferred into a warehouse of the semiconductor factory. That is, the predicted failure time of each of devices and parts, such as the motor, the paddle device, the motor that drives the paddle, or the sensor may be calculated using the failure prediction method for each equipment such as the sensor and the motor of each of the semiconductor manufacturing apparatuses 1-1000, 2-1000 described above. Based on this calculated predicted failure time, an order command signal for each of these devices and parts may be previously generated before a predetermined time arrives (e.g. one week before), to transmit the order command signal from the semiconductor factory to the support center 1002. The order command signal is generated in each of the controllers 1-175, 2-175, or the semiconductor factory server 1001. In this manner, it is possible to previously stock required replacement parts for equipment in the semiconductor factory in required timing. This can prevent hindrance of the operation of the semiconductor manufacturing apparatus due to a situation of back-ordering for each equipment.

As another embodiment different from FIG. 22, in the controllers 1-175, 2-175 described above, after conversion of the data to the easily analyzable data, this data may be transmitted one after another or on a regular basis via the controllers 1-175, 2-175 and the computers 1-190, 2-190 to the support center 1002 of the manufacturer of semiconductor manufacturing apparatuses, directly or via the semiconductor factory server 1001. Then, in the support center 1002 of the manufacturer of semiconductor manufacturing apparatuses, a failure of each equipment such as the sensor and the motor of the each of the semiconductor manufacturing apparatuses 1-1000, 2-1000 may be predicted based on the received data.

Note that the above are mere illustration, and the failure prediction process of the above embodiment is applicable to failure prediction of drive units, sensors, and the like included in the semiconductor manufacturing apparatus and other apparatuses.

At least following technical concept can be recognized from the above described embodiments.

[1] According to a first aspect, a semiconductor manufacturing apparatus is provided. This semiconductor manufacturing apparatus includes: a first device; one or more sensors that detect physical quantities indicating a state of the first device; a first calculation circuit that calculates one or more feature quantities of the first device from the detected physical quantities; and a failure prediction circuit that compares the one or more feature quantities calculated in the first calculation circuit with a plurality of pieces of model data of a temporal change in one or more feature quantities until the first device fails, decides a piece of model data with the minimum difference from the calculated one or more feature quantities among the plurality of pieces of model data, calculates predicted failure time from a difference between a failure point in time and a point in time at which a difference from the calculated one or more feature quantities is the minimum in the piece of model data, and stops receiving a new substrate when the predicted failure time is smaller than a predetermined threshold. The first calculation circuit and the failure prediction circuit can be made up of a program for performing the above process and a computer for running that program. Alternatively, the first calculation circuit and the failure prediction circuit may be made up of hardware dedicated to an application specific integrated circuit such as an ASIC or a PLC. The functions of the first calculation circuit and the failure prediction circuit may be divided and achieved in a plurality of devices (a plurality of computers, a plurality of pieces of application specific hardware, or a combination of one or more computers or one or more pieces of application specific hardware).

According to the first aspect, comparison is made between the one or more measured feature quantities and a plurality of pieces of model data of a temporal change in one or more feature quantities until the first device fails, thereby enabling specification of an abnormality generated portion (type of abnormality). Further, the current state (one or more feature quantities) of the first device with respect to one or more feature quantities at the failure point in time is found, thereby enabling calculation of predicted time until the failure. That is, it is possible to specify the abnormality generated portion (type of abnormality) and the predicted time until the failure.

Moreover, reception of a new substrate is stopped when the predicted time falls below a predetermined threshold, thereby enabling prevention of failure of the first device while the substrate is being processed.

Note that previously setting the threshold of the predetermined time longer than the process time for one substrate enables prevention of failure of the first device while the substrate is being processed.

[2] According to a second aspect, the semiconductor manufacturing apparatus of the first aspect further includes an identification circuit generated by machine learning based on a set of one or more feature quantities at normal time of the first device and a set of one or more feature quantities at abnormal time of the first device. The identification circuit evaluates the one or more measured feature quantities of the first device, to determine whether the first device is normal or abnormal, and a process of the failure prediction circuit is performed when the identification circuit determines that the first device is abnormal. This identification circuit can be made up of, for example, a program for mechanical learning and a computer for running that program. In another example, the identification circuit can also be made up of hardware dedicated to an application specific integrated circuit such as an ASIC or a PLC. The function of the identification circuit may be divided and achieved in a plurality of devices (a plurality of computers, a plurality of pieces of application specific hardware, or a combination of one or more computers or one or more pieces of application specific hardware).

According to the second aspect, the identification circuit determines whether the first device is normal or abnormal, and the process of the failure prediction circuit is performed when the identification circuit determines that the first device is abnormal, so that it is possible to improve the accuracy in abnormality determination. Further, the process of the failure prediction circuit can be limited to a case where the identification circuit determines abnormality, and hence the process of the failure prediction circuit can be reduced.

[3] According to a third aspect, in the semiconductor manufacturing apparatus of the second aspect, a determination reference of the identification circuit is updated by updating the set of the one or more feature quantities at the normal time and/or the set of the one or more feature quantities at the abnormal time.

According to the third aspect, updating the determination reference of the identification circuit can hold and/or improve the accuracy in failure prediction.

[4] According to a fourth aspect, the semiconductor manufacturing apparatus of any one of the first to the third aspects further includes a model data creation circuit that creates a plurality of pieces of model data of a temporal change in one or more feature quantities until the first device fails.

According to the fourth aspect, it is possible to create a plurality of pieces of model data in the semiconductor manufacturing apparatus without using an external apparatus.

[5] According to a fifth aspect, in the semiconductor manufacturing apparatus of any one of the first to fourth aspects, the first device is a motor, and the physical quantities include at least one of a load factor, vibration, sound, and a temperature of the motor.

According to the fifth aspect, when abnormality occurs in the motor included in the semiconductor manufacturing apparatus, it is possible to accurately obtain the predicted time until the failure of the motor.

[6] According to a sixth aspect, in the semiconductor manufacturing apparatus of the fifth aspect, the feature quantities include at least one of the load factor, the vibration, a waveform amplitude of the sound, an inclination of an asymptote, a frequency spectrum, an overall value (total average value, an average of all values), an average value of a waveform peak distribution, and a standard deviation.

According to the sixth aspect, feature quantities concerning the motor are appropriately selected or combined, so that it is possible to appropriately calculate the time until detection of abnormality of the motor and the failure thereof.

[7] According to a seventh aspect, in the semiconductor manufacturing apparatus of the fifth or sixth aspect, the first device is a paddle device, and the feature quantities include at least one of a shift amplitude, a shift rate, a shift acceleration, and an inclination of a shaft of a paddle.

According to the seventh aspect, feature quantities concerning the paddle device are appropriately selected or combined, so that it is possible to appropriately calculate the time until detection of abnormality of the paddle device and the failure thereof.

[8] According to an eighth aspect, in the semiconductor manufacturing apparatus of any one of the first to fourth aspects, the first device is a sensor, and the feature quantities include at least one of a detection delay time, a number of chatterings, and a chattering duration time of the sensor.

According to the eighth aspect, feature quantities concerning the sensor are appropriately selected or combined, so that it is possible to appropriately calculate the time until detection of abnormality of the sensor and the failure thereof.

[9] According to a ninth aspect, a semiconductor manufacturing apparatus is provided. This semiconductor manufacturing apparatus includes: a first device; one or more sensors that detect physical quantities indicating a state of the first device; a first calculation circuit that calculates one or more feature quantities of the first device from the detected physical quantities; and a failure prediction circuit that monitors a temporal change in the one or more feature quantities calculated in the first calculation circuit, and stops receiving a new substrate when a duration for which a degree of deviation of the one or more feature quantities from those (one or more feature quantities) at the normal time exceeds a first time, and/or when a number of increases and decreases per unit time in the degree of deviation of the one or more feature quantities from those at the normal time exceeds a first number.

According to the ninth aspect, reception of a new substrate is stopped when the duration for which the deviation degree of the feature quantities of the first device from those at the normal time increases exceeds the first time, and/or when the number of increases and decreases per unit time exceeds the first number. Hence it is possible to predict the failure by monitoring the temporal change in feature quantities without previously creating model data for failure.

[10] According to a tenth aspect, the semiconductor manufacturing apparatus of the ninth aspect includes an identification circuit that evaluates the one or more measured feature quantities of the first device based on a set of the one or more feature quantities at the normal time of the first device, to determine whether the first device is normal or abnormal. A process of the failure prediction circuit is performed when the identification circuit determines that the first device is abnormal. This identification circuit can be made up of, for example, a predetermined program and a computer for running that program. In another example, the identification circuit can also be made up of hardware dedicated to an application specific integrated circuit such as an ASIC or a PLC. The function of the identification circuit may be divided and achieved in a plurality of devices (a plurality of computers, a plurality of pieces of application specific hardware, or a combination of one or more computers or one or more pieces of application specific hardware).

According to the tenth aspect, the identification circuit determines whether the first device is normal or abnormal, and the process of the failure prediction circuit is performed when the identification circuit determines that the first device is abnormal, so that it is possible to improve the accuracy in abnormality determination. Further, the process of the failure prediction circuit can be limited to a case where the identification circuit determines abnormality, and hence the process of the failure prediction circuit can be reduced.

[11] According to an eleventh aspect, in the semiconductor manufacturing apparatus of the tenth aspect, a determination reference of the identification circuit is updated by adding a set of the one or more feature quantities at the normal time and using accumulated sets of the one or more feature quantities at the normal time.

According to the eleventh aspect, a piece of normal data newly acquired on a daily basis is added to enable updating of the determination reference of the identification circuit based on the accumulated sets of pieces of normal data. This can hold and/or improve the accuracy in failure prediction.

[12] According to a twelfth aspect, in the semiconductor manufacturing apparatus of any one of the ninth to eleventh aspects, the first device is a motor, and the physical quantities include at least one of a load factor, vibration, sound, and a temperature of the motor.

According to the twelfth aspect, it is possible to appropriately perform failure prediction of the motor included in the semiconductor manufacturing apparatus.

[13] According to a thirteenth aspect, in the semiconductor manufacturing apparatus of the twelfth aspect, the feature quantities include at least one of the load factor, the vibration, a waveform amplitude of the sound, an inclination of an asymptote, a frequency spectrum, an overall value, an average value of a waveform peak distribution, and a standard deviation.

According to the thirteenth aspect, feature quantities concerning the motor are appropriately selected or combined, so that it is possible to appropriately predict the failure of the motor.

[14] According to a fourteenth aspect, in the semiconductor manufacturing apparatus of the twelfth or thirteenth aspect, the first device is a paddle device, and the feature quantities include at least one of a shift amplitude, a shift rate, a shift acceleration, and an inclination of a shaft of a paddle.

According to the fourteenth aspect, feature quantities concerning the paddle device are appropriately selected or combined, so that it is possible to appropriately predict the failure of the paddle device.

[15] According to a fifteenth aspect, in the semiconductor manufacturing apparatus of any one of the ninth to eleventh aspects, the first device is a sensor, and the feature quantities include at least one of a detection delay time, a number of chatterings, and a chattering duration time of the sensor.

According to the fifteenth aspect, feature quantities concerning the sensor are appropriately selected or combined, so that it is possible to appropriately predict the failure of the sensor.

[16] According to a sixteenth aspect, a failure prediction method for a semiconductor manufacturing apparatus is provided. This failure prediction method includes: measuring one or more feature quantities showing a state of a first device included in the semiconductor manufacturing apparatus; comparing the one or more measured feature quantities with a plurality of pieces of model data of a temporal change in one or more feature quantities until the first device fails, to decide a piece of model data with the minimum difference from the calculated one or more feature quantities among the plurality of pieces of model data; and calculating predicted failure time from a difference between a failure point in time and a point in time at which a difference from the calculated one or more feature quantities is the minimum in the piece of model data, and stopping reception of a new substrate when the predicted failure time is smaller than a predetermined threshold. According to the sixteenth aspect, a similar effect to that of the first aspect is produced.

[17] According to a seventeenth aspect, a failure prediction method for a semiconductor manufacturing apparatus is provided. This failure prediction method includes: monitoring a temporal change in one or more feature quantities of a first device included in the semiconductor manufacturing apparatus; and stopping reception of a new substrate when a duration for which a degree of deviation of the one or more feature quantities from those (one or more feature quantities) at the normal time exceeds a first time, and/or when a number of increases and decreases per unit time in the degree of deviation of the one or more feature quantities from those at the normal time exceeds a first number. According to the seventeenth aspect, a similar effect to that of the ninth aspect is produced.

[18] According to an eighteenth aspect, there is provided a storage medium that stores a program for causing a computer to perform a failure prediction method for a semiconductor manufacturing apparatus. This program includes: measuring one or more feature quantities showing a state of a first device included in the semiconductor manufacturing apparatus; comparing the one or more measured feature quantities with a plurality of pieces of model data of a temporal change in one or more feature quantities until the first device fails, to decide a piece of model data with the minimum difference from the calculated one or more feature quantities among the plurality of pieces of model data; and calculating predicted failure time from a difference between a failure point in time and a point in time at which a difference from the calculated one or more feature quantities is the minimum in the piece of model data, and stopping reception of a new substrate when the predicted failure time is smaller than a predetermined threshold. According to the eighteenth aspect, a similar effect to that of the first aspect is produced.

[19] According to a nineteenth aspect, there is provided a storage medium that stores a program for causing a computer to perform a failure prediction method for a semiconductor manufacturing apparatus. This program includes: monitoring a temporal change in one or more feature quantities of a first device included in the semiconductor manufacturing apparatus; and stopping reception of a new substrate when a duration for which a degree of deviation of the one or more feature quantities from those (one or more feature quantities) at the normal time exceeds a first time, and/or when a number of increases and decreases per unit time in the degree of deviation of the one or more feature quantities from those at the normal time exceeds a first number. According to the nineteenth aspect, a similar effect to that of the ninth aspect is produced.

[20] According to a twentieth aspect, there is provided a management system for a first device of a semiconductor manufacturing apparatus installed in a semiconductor factory. In this management system, the first device is any one of a motor, a paddle device, a motor for driving a paddle, or a sensor. The management system performs the failure prediction method for the semiconductor manufacturing apparatus according to the sixteenth or seventeenth aspect, and the management system generates an order command signal of the first device before at least one of the predicted failure time of the first device calculated by the failure prediction method, the a duration for which the degree of deviation increases, and the number of increases and decreases per unit time in the degree of deviation reaches the predetermined threshold, the first time, or the first number, and the management system transmits the order command signal from the semiconductor factory to a support center.

According to the twentieth aspect, it is possible to previously stock in the semiconductor factory replacement parts for equipment, which are required at necessary timings. This can prevent hindrance of the operation of the semiconductor manufacturing apparatus due to a situation of backordering for each instrument.

Although the embodiments of the present invention have been described based on some examples, the above embodiments of the present invention are intended to facilitate understanding of the present invention and not to limit the present invention. The present invention can be changed and modified without deviating from its gist, and the present invention naturally includes an equivalent thereto. Further, in a range where at least part of the problem described above can be solved or a range where at least part of the effect is exerted, each of the constituents described in the claims and the specification can be combined in a freely selectable manner or can be omitted.

The present application claims priority to Japanese Patent Application No. 2017-075436 filed on Apr. 5, 2017. The entire disclosure of Japanese Patent Application No. 2017-075436 filed on Apr. 5, 2017 including specification, claims, drawings and summary is incorporated herein by reference in its entirety.

The entire disclosure of Japanese Patent No. 5184308 (Patent Literature 1), Japanese Unexamined Patent Application Publication (Kokai) No. 2016-127069 (Patent Literature 2), Japanese Unexamined Patent Application Publication (Kokai) No. 2014-169475 (Patent Literature 3), including specification, claims, drawings and summary is incorporated herein by reference in its entirety.

REFERENCE SIGNS LIST

10 . . . tank
11 . . . substrate holder
14 . . . pump
16 . . . solution supply channel
18 . . . paddle
19 . . . paddle driving device
20 . . . constant temperature unit
22 . . . filter
26 . . . anode
28 . . . anode holder
30 . . . power source
32 . . . paddle
34 . . . regulation plate
36 . . . cramp
38 . . . shaft
40 . . . shaft holding unit
42 . . . drive unit
44 . . . motor
46 . . . control unit
50 . . . cell
51 . . . overflow tank
61 . . . acceleration sensor
62 . . . microphone
63 . . . temperature sensor
64 . . . shift sensor
100 . . . cassette
102 . . . cassette table
104 . . . aligner
106 . . . spin rinse drier
106 . . . chuck jaw
120 . . . substrate setting/removing unit
122 . . . substrate carrier device
123 . . . robot hand
123 . . . hook portion
124 . . . stocker
124 . . . sensor
125 . . . driving device
126 . . . pre-wetting tank
128 . . . pre-soaking tank
132 . . . blow tank
140 . . . substrate holder carrier device
142 . . . first transporter
144 . . . second transporter
150 . . . rail
152 . . . placement plate
175 . . . controller
180 . . . paddle device
18a . . . long hole
18a . . . long hole
18b . . . lattice portion
18b . . . each lattice portion
300 . . . substrate holder setting/removing device
302 . . . shaft
304 . . . disk
306 . . . disk
312 . . . motor
34A . . . cylindrical portion
34B . . . flange portion
50A . . . solution supply port
123a . . . hook portion
130a . . . first cleaning tank
130b . . . second cleaning tank
170A . . . unloading unit
170B . . . treatment unit
175B . . . memory
175C . . . control unit
310a . . . holder locking pin
1-1000, 2-1000 . . . semiconductor manufacturing apparatus
1-175, 2-175 . . . controller
1-190, 2-190 . . . computer
1001 . . . semiconductor factory server
1002 . . . support center

What is claimed is:

1. A semiconductor manufacturing apparatus, comprising:
   a first device;
   one or more sensors that detect physical quantities indicating a state of the first device;
   a first calculation circuit that calculates one or more feature quantities of the first device from the detected physical quantities; and
   a second circuit that monitors a temporal change in the one or more feature quantities calculated in the first calculation circuit, and stops receiving a new substrate when a duration for which a degree of deviation of the one or more feature quantities from those at a normal time is increasing exceeds a first time, and/or when a number of increases and decreases per unit time in the degree of deviation of the one or more feature quantities from those at the normal time exceeds a first number, wherein
   the first device is a motor, and
   the physical quantities include at least one of a load factor, vibration, sound, and a temperature of the motor.

2. The semiconductor manufacturing apparatus according to claim 1, further comprising
   an identification circuit that evaluates the one or more measured feature quantities of the first device based on a set of the one or more feature quantities at the normal time of the first device, to determine whether the first device is normal or abnormal,
   wherein a process of the second circuit is performed when the identification circuit determines that the first device is abnormal.

3. The semiconductor manufacturing apparatus according to claim 2,
   wherein a determination reference of the identification circuit is updated by adding a set of the one or more feature quantities at the normal time and using accumulated sets of the one or more feature quantities at the normal time.

4. The semiconductor manufacturing apparatus according to claim 1,
   wherein the feature quantities include at least one of the load factor, the vibration, a waveform amplitude of the sound, an inclination of an asymptote, a frequency spectrum, an overall value, an average value of a waveform peak distribution, and a standard deviation.

5. The semiconductor manufacturing apparatus according to claim 1, wherein
   the first device is a motor for driving a paddle, and
   the feature quantities include at least one of a shift amplitude, a shift rate, a shift acceleration, and an inclination of a shaft of the paddle.

6. A method for a semiconductor manufacturing apparatus, the method comprising:
   monitoring a temporal change in one or more feature quantities of a first device included in the semiconductor manufacturing apparatus; and
   stopping reception of a new substrate when a duration for which a degree of deviation of the one or more feature quantities from those at a normal time is increasing exceeds a first time, and/or when a number of increases and decreases per unit time in the degree of deviation of the one or more feature quantities from those at the normal time exceeds a first number, wherein
   the first device is a motor, and
   the physical quantities include at least one of a load factor, vibration, sound, and a temperature of the motor.

7. A management system for a first device of a semiconductor manufacturing apparatus installed in a semiconductor factory, wherein
   the management system performs a method for the semiconductor manufacturing apparatus according to claim 6, and
   the management system generates an order command signal of the first device before the duration for which the degree of deviation increases reaches the first time, or the number of increases and decreases per unit time in the degree of deviation reaches the first number, and
   the management system transmits the order command signal from the semiconductor factory to a support center.

8. A storage medium that stores a program for causing a computer to perform actions for a semiconductor manufacturing apparatus, the actions including
   monitoring a temporal change in one or more feature quantities of a first device included in the semiconductor manufacturing apparatus, and
   stopping reception of a new substrate when a duration for which a degree of deviation of the one or more feature quantities from those at a normal time exceeds a first time, and/or when a number of increases and decreases per unit time in the degree of deviation of the one or more feature quantities from those at the normal time exceeds a first number, wherein
   the first device is a motor, and
   the physical quantities include at least one of a load factor, vibration, sound, and a temperature of the motor.

9. A semiconductor manufacturing apparatus, comprising:
   a first device;
   one or more sensors that detect physical quantities indicating a state of the first device;
   a first calculation circuit that calculates one or more feature quantities of the first device from the detected physical quantities; and
   a second circuit that monitors a temporal change in the one or more feature quantities calculated in the first calculation circuit, and stops receiving a new substrate when a duration for which a degree of deviation of the one or more feature quantities from those at a normal time is increasing exceeds a first time, and/or when a number of increases and decreases per unit time in the degree of deviation of the one or more feature quantities from those at the normal time exceeds a first number, wherein
   the first device is a sensor, and
   the feature quantities include at least one of a detection delay time, a number of chatterings, and a chattering duration time of the sensor.

10. A method for a semiconductor manufacturing apparatus, the method comprising:
    monitoring a temporal change in one or more feature quantities of a first device included in the semiconductor manufacturing apparatus; and
    stopping reception of a new substrate when a duration for which a degree of deviation of the one or more feature quantities from those at a normal time is increasing exceeds a first time, and/or when a number of increases and decreases per unit time in the degree of deviation of the one or more feature quantities from those at the normal time exceeds a first number wherein
    the first device is a sensor, and
    the feature quantities include at least one of a detection delay time, a number of chatterings, and a chattering duration time of the sensor.

11. A storage medium that stores a program for causing a computer to perform actions for a semiconductor manufacturing apparatus, the actions including
- monitoring a temporal change in one or more feature quantities of a first device included in the semiconductor manufacturing apparatus, and
- stopping reception of a new substrate when a duration for which a degree of deviation of the one or more feature quantities from those at a normal time exceeds a first time, and/or when a number of increases and decreases per unit time in the degree of deviation of the one or more feature quantities from those at the normal time exceeds a first number, wherein
- the first device is a sensor, and
- the feature quantities include at least one of a detection delay time, a number of chatterings, and a chattering duration time of the sensor.

* * * * *